United States Patent
Ohbayashi

(10) Patent No.: US 7,505,339 B2
(45) Date of Patent: Mar. 17, 2009

(54) STATIC SEMICONDUCTOR MEMORY DEVICE ALLOWING SIMULTANEOUS WRITING OF DATA INTO A PLURALITY OF MEMORY CELLS

(75) Inventor: Shigeki Ohbayashi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 107 days.

(21) Appl. No.: 11/451,312

(22) Filed: Jun. 13, 2006

(65) Prior Publication Data
US 2006/0285400 A1    Dec. 21, 2006

(30) Foreign Application Priority Data
Jun. 13, 2005    (JP) .............................. 2005-171864

(51) Int. Cl.
G11C 29/00    (2006.01)
G11C 7/00    (2006.01)
(52) U.S. Cl. ..................... 365/201; 365/154; 365/203; 365/202; 365/226
(58) Field of Classification Search .................. 365/154
See application file for complete search history.

(56) References Cited

U.S. PATENT DOCUMENTS 5,276,647 A * 1/1994 Matsui et al. ............... 365/201
6,392,941 B1 * 5/2002 Churchill .................... 365/201
6,741,510 B2 * 5/2004 Ohbayashi et al. .......... 365/201
7,016,251 B2 * 3/2006 Gabric et al. ............... 365/226
7,050,342 B2 * 5/2006 Gans et al. .................. 365/201
7,154,795 B2 * 12/2006 Parris et al. ................. 365/203
2007/0035986 A1 * 2/2007 Houston ..................... 365/154

FOREIGN PATENT DOCUMENTS

JP    04-232693    8/1992
JP    2003-249099    9/2003

* cited by examiner

*Primary Examiner*—Huan Hoang
*Assistant Examiner*—Michael J Weinberg
(74) *Attorney, Agent, or Firm*—McDermott Will & Emery LLP

(57) ABSTRACT

A supply instruction signal attains the H-level before data is written into a plurality of memory cells. A P-channel MOS transistor is arranged between a power supply node and an input node. The P-channel MOS transistor is turned off to open the input node according to the supply instruction signal. In this case, a write driver discharges electric charges accumulated on the input node and electric charges accumulated on a bit line pair. However, a through-current does not flow from the power supply node to a ground node so that flow of the through-current to a CMOS inverter circuit forming each memory cell can be prevented. Accordingly, such a static semiconductor memory device can be provided that can prevent the flow of the through-current to the CMOS inverter circuit forming each memory cell when simultaneously writing data into the plurality of memory cells.

10 Claims, 22 Drawing Sheets

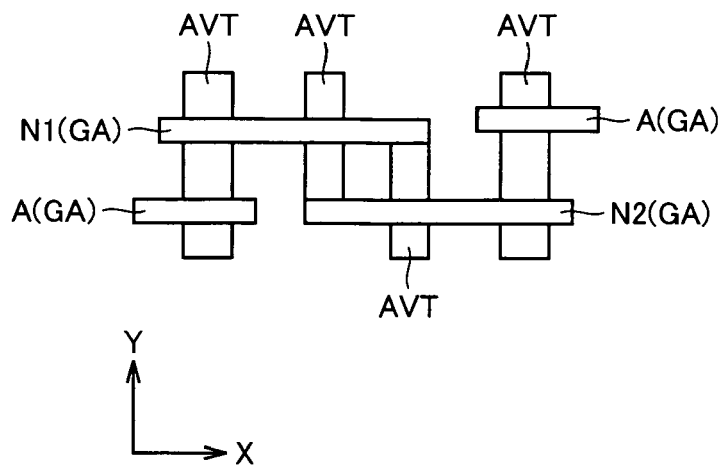

FIG.25

| | all-1 | | | | | | | |
|---|---|---|---|---|---|---|---|---|
| EVEN-NUMBERED ROW WL=H | N1=H A=H | A=H N2=L | A=H N2=H | N1=L A=H | N1=H A=H | A=H N2=L | A=H N2=H | N1=L A=H |
| ODD-NUMBERED ROW WL=H | A=H N1=H | N2=L A=H | N2=H A=H | A=H N1=L | A=H N1=H | N2=L A=H | N2=H A=H | A=H N1=L |
| EVEN-NUMBERED ROW WL=H | N1=H A=H | A=H N2=L | A=H N2=H | N1=L A=H | N1=H A=H | A=H N2=L | A=H N2=H | N1=L A=H |
| ODD-NUMBERED ROW WL=H | A=H N1=H | N2=L A=H | N2=H A=H | A=H N1=L | A=H N1=H | N2=L A=H | N2=H A=H | A=H N1=L |
| | | COLUMN =H | COLUMN =H | | COLUMN =H | | COLUMN =H | |

FIG.26

| | all-0 | | | | | | | |
|---|---|---|---|---|---|---|---|---|
| EVEN-NUMBERED ROW WL=H | N1=L A=H | A=H N2=H | A=H N2=L | N1=H A=H | N1=L A=H | A=H N2=H | A=H N2=L | N1=H A=H |
| ODD-NUMBERED ROW WL=H | A=H N1=L | N2=H A=H | N2=L A=H | A=H N1=H | A=H N1=L | N2=H A=H | N2=L A=H | A=H N1=H |
| EVEN-NUMBERED ROW WL=H | N1=L A=H | A=H N2=H | A=H N2=L | N1=H A=H | N1=L A=H | A=H N2=H | A=H N2=L | N1=H A=H |
| ODD-NUMBERED ROW WL=H | A=H N1=L | N2=H A=H | N2=L A=H | A=H N1=H | A=H N1=L | N2=H A=H | N2=L A=H | A=H N1=H |
| | COLUMN =L | | COLUMN =L | | COLUMN =L | | COLUMN =L | |

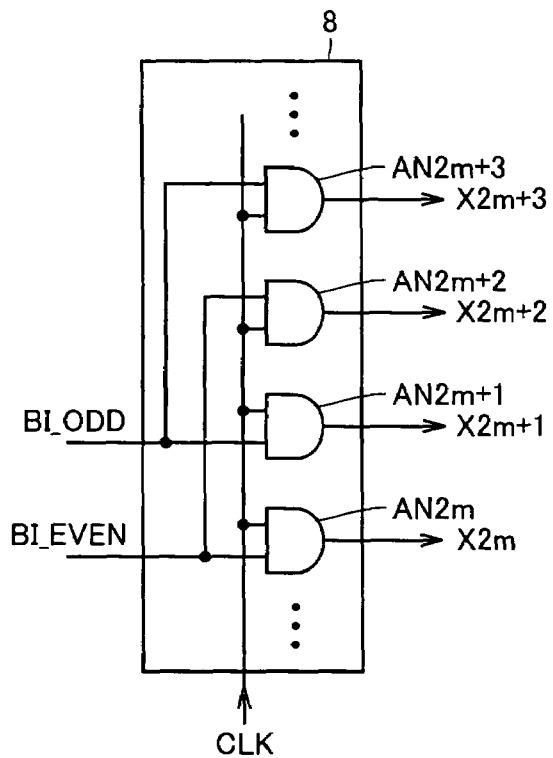

FIG.27

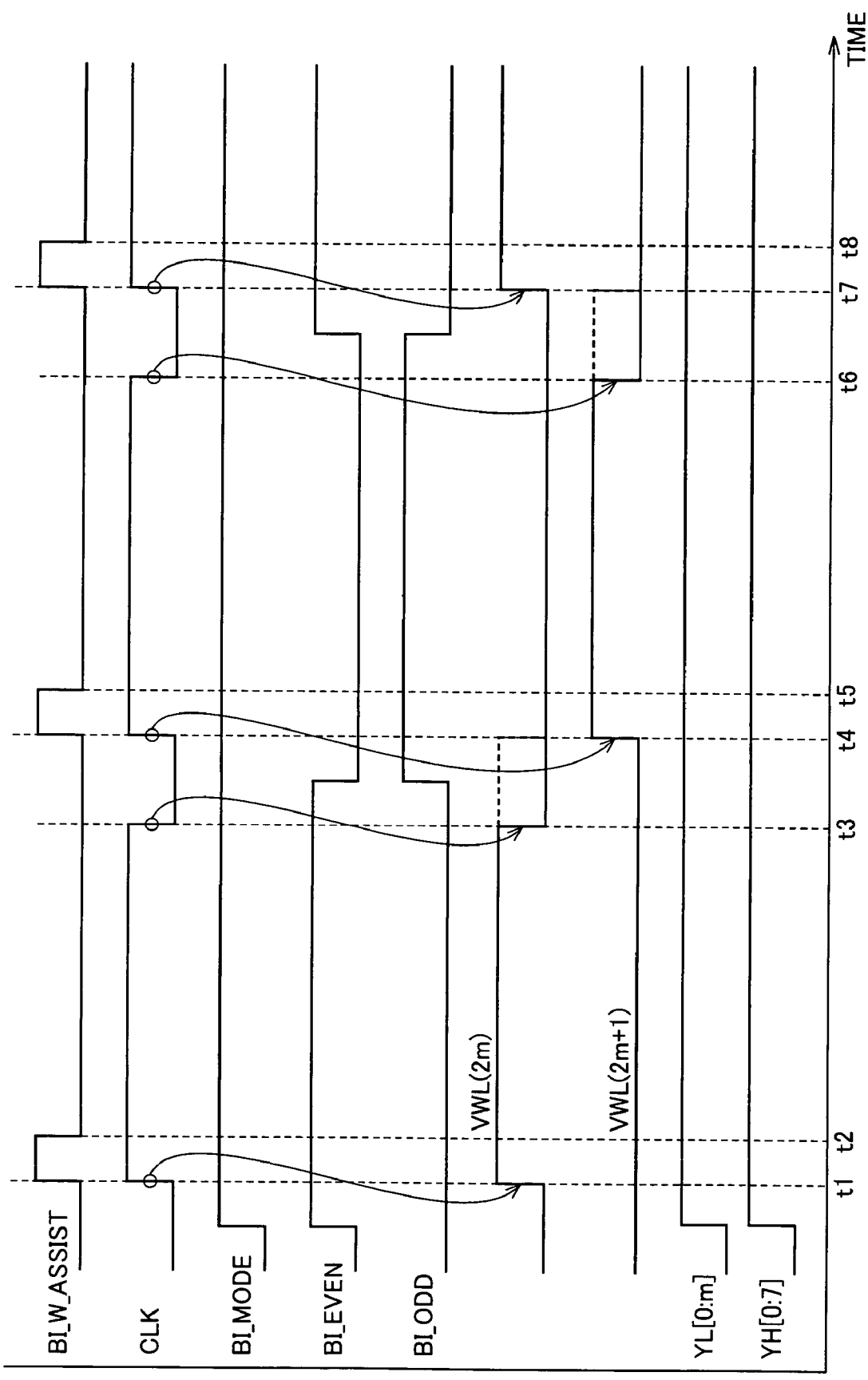

FIG.29

| | | | | | | | | |
|---|---|---|---|---|---|---|---|---|
| ODD-NUMBERED ROW WL=L | A=L<br>N1=X | N2=X<br>A=L | N2=X<br>A=L | A=L<br>N1=X | A=L<br>N1=X | N2=X<br>A=L | N2=X<br>A=L | A=L<br>N1=X |
| EVEN-NUMBERED ROW WL=H | N1=H<br>A=H | A=H<br>N2=L | A=H<br>N2=H | N1=L<br>A=H | N1=H<br>A=H | A=H<br>N2=L | A=H<br>N2=H | N1=L<br>A=H |
| ODD-NUMBERED ROW WL=L | A=L<br>N1=X | N2=X<br>A=L | N2=X<br>A=L | A=L<br>N1=X | A=L<br>N1=X | N2=X<br>A=L | N2=X<br>A=L | A=L<br>N1=X |
| EVEN-NUMBERED ROW WL=H | N1=H<br>A=H | A=H<br>N2=L | A=H<br>N2=H | N1=L<br>A=H | N1=H<br>A=H | A=H<br>N2=L | A=H<br>N2=H | N1=L<br>A=H |
| | COLUMN =H | | COLUMN =H | | COLUMN =H | | COLUMN =H | |

FIG.30

| | | | | | | | | |
|---|---|---|---|---|---|---|---|---|
| ODD-NUMBERED ROW WL=L | A=L<br>N1=X | N2=X<br>A=L | N2=X<br>A=L | A=L<br>N1=X | A=L<br>N1=X | N2=X<br>A=L | N2=X<br>A=L | A=L<br>N1=X |
| EVEN-NUMBERED ROW WL=H | N1=L<br>A=H | A=H<br>N2=H | A=H<br>N2=L | N1=H<br>A=H | N1=L<br>A=H | A=H<br>N2=H | A=H<br>N2=L | N1=H<br>A=H |
| ODD-NUMBERED ROW WL=L | A=L<br>N1=X | N2=X<br>A=L | N2=X<br>A=L | A=L<br>N1=X | A=L<br>N1=X | N2=X<br>A=L | N2=X<br>A=L | A=L<br>N1=X |
| EVEN-NUMBERED ROW WL=H | N1=L<br>A=H | A=H<br>N2=H | A=H<br>N2=L | N1=H<br>A=H | N1=L<br>A=H | A=H<br>N2=H | A=H<br>N2=L | N1=H<br>A=H |
| | COLUMN =L | | COLUMN =L | | COLUMN =L | | COLUMN =L | |

FIG.31

| ODD-NUMBERED ROW WL=H | A=H  N2=L  N1=H  A=H | N2=H  A=H  A=H  N1=L | A=H  N2=L  N1=H  A=H | N2=H  A=H  A=H  N1=L |
|---|---|---|---|---|
| EVEN-NUMBERED ROW WL=L | N1=X  A=L  A=L  N2=X | A=L  N1=X  N2=X  A=L | N1=X  A=L  A=L  N2=X | A=L  N1=X  N2=X  A=L |
| ODD-NUMBERED ROW WL=H | A=H  N2=L  N1=H  A=H | N2=H  A=H  A=H  N1=L | A=H  N2=L  N1=H  A=H | N2=H  A=H  A=H  N1=L |
| EVEN-NUMBERED ROW WL=L | N1=X  A=L  A=L  N2=X | A=L  N1=X  N2=X  A=L | N1=X  A=L  A=L  N2=X | A=L  N1=X  N2=X  A=L |
|  | COLUMN =H | COLUMN =H | COLUMN =H | COLUMN =H |

FIG.32

| ODD-NUMBERED ROW WL=H | A=H  N2=H  N1=L  A=H | N2=L  A=H  A=H  N1=H | A=H  N2=H  N1=L  A=H | N2=L  A=H  A=H  N1=H |
|---|---|---|---|---|
| EVEN-NUMBERED ROW WL=L | N1=X  A=L  A=L  N2=X | A=L  N1=X  N2=X  A=L | N1=X  A=L  A=L  N2=X | A=L  N1=X  N2=X  A=L |
| ODD-NUMBERED ROW WL=H | A=H  N2=H  N1=L  A=H | N2=L  A=H  A=H  N1=H | A=H  N2=H  N1=L  A=H | N2=L  A=H  A=H  N1=H |
| EVEN-NUMBERED ROW WL=L | N1=X  A=L  A=L  N2=X | A=L  N1=X  N2=X  A=L | N1=X  A=L  A=L  N2=X | A=L  N1=X  N2=X  A=L |
|  | COLUMN =L | COLUMN =L | COLUMN =L | COLUMN =L |

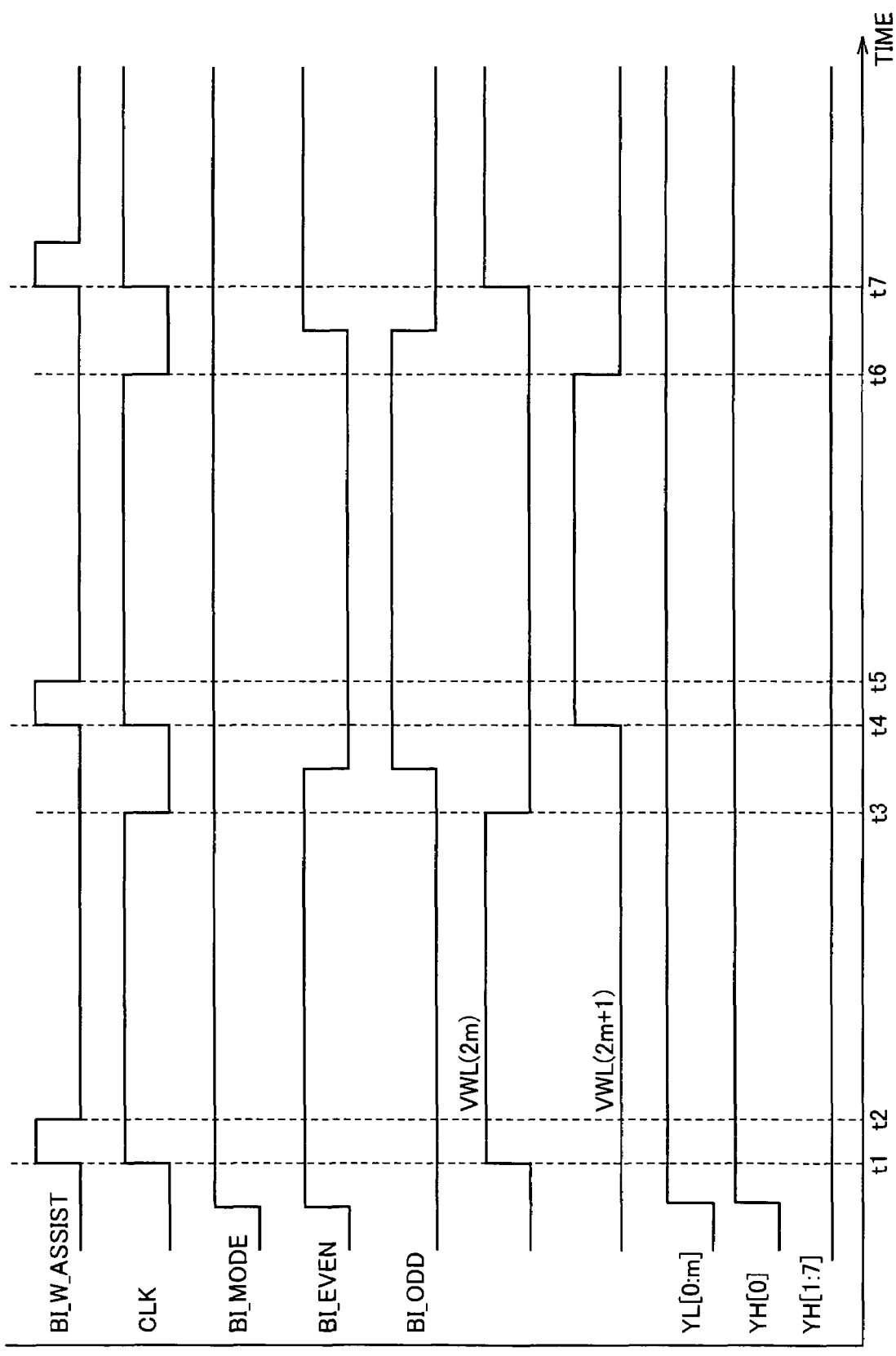

STATIC SEMICONDUCTOR MEMORY DEVICE ALLOWING SIMULTANEOUS WRITING OF DATA INTO A PLURALITY OF MEMORY CELLS

BACKGROUND OF THE INVENTION

1. Field of the Invention

The present invention relates to a static semiconductor memory device that allows simultaneous writing of data into memory cells connected to a plurality of selected word lines.

2. Description of the Background Art

As semiconductor memory devices having a high capacity for data storage, SRAMs (Static Random Access Memories), DRAMs (Dynamic Random Access Memories) and others have been put into practical use.

The semiconductor memory devices are shipped after determining pass/fail. The determination of pass/fail is performed by actually inputting and outputting data to and from memory cells included in the semiconductor memory device, and thereby determining whether written and read data matches with each other or not, or by applying a stress thereto by burn-in.

In recent years, the capacity of semiconductor memory devices has been increasing so that portions to be subjected to stresses in the semiconductor memory device have been increasing in number. This increases a test time for the burn-in, and thus causes a problem of a high cost. For overcoming this problem, Japanese Patent Laying-Open No. 04-232693 has disclosed a static semiconductor memory device including a word line drive circuit that is controlled to select and drive simultaneously all word lines in a voltage stress test, and a bit line load circuit that is controlled not to apply a bias potential to at least one of paired bit lines or to apply the bias potential lower than that in a normal operation to the bit line pair in the voltage stress test.

For applying a stress to the memory cell, it is preferable to set the memory cell to the write state by setting the potential of the word line to an H-level such that a maximum potential difference may be exerted on the bit lines and the storage nodes in the memory cell. For simultaneously applying the stress to many memory cells, it is effective to raise simultaneously many word lines and thereby to set the memory cells connected to each word line to the write state.

The stress applying method described above is practically available in DRAMs. However, when it is attempted in a full CMOS (Complementary Metal Oxide Semiconductor) SRAM to apply the stress to memory cells by simultaneously raising many word lines and performing the write operation, a balance is not kept between a total of current capabilities of load P-channel MOS transistors included in each memory cell and current capabilities of N-channel MOS transistors included in a write driver. In the full CMOS-SRAM, therefore, it becomes difficult to perform the simultaneous writing into the plurality of memory cells. This is because the size of the ordinary write driver is determined based on the assumption that the ordinary write driver performs the writing on one of the memory cells on one bit line pair. When the size of the write driver is determined to allow simultaneous writing into, e.g., 100 or more memory cells, this results in a problem that an area penalty becomes excessively large.

When the write state continues without changing information stored in the memory cell, a through-current flows in a CMOS inverter circuit forming the memory cell, and causes a problem that a large current flows through the whole semiconductor memory device.

SUMMARY OF THE INVENTION

An object of the invention is to provide a static semiconductor memory device that can prevent flow of a through-current in a CMOS inverter circuit forming each memory cell when data is simultaneously written into the plurality of memory cells.

In summary, the invention provides a static semiconductor memory device including a plurality of memory cells arranged in rows and columns, and each having a storage node pair statically holding complementary potentials while a power supply potential is being supplied; a plurality of word lines arranged for the respective rows of the plurality of memory cells; a row select circuit selecting a plurality of target word lines as a unit from among the plurality of word lines according to a provided row select signal; a power supply circuit supplying a power supply potential to each of the plurality of memory cells in response to activation of a supply instruction signal, and stopping the supply of the power supply potential to each of the plurality of memory cells in response to inactivation of the supply instruction signal; and a write circuit writing data into memory cells connected to the plurality of target word lines among the plurality of memory cells.

A major advantage of the invention is as follows. Before writing the data into the memory cell, the write driver lowers the potential of the bit line, and stops the supply of the power supply potential to the memory cell. In the write operation, the complementary potentials are applied to the bit line pair to fix the potentials of the storage node pair in the memory cell, and then the power supply potential is supplied to the memory cell. Therefore, it is possible to prevent flow of the through-current in the CMOS inverter circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 24 schematically shows a plan layout of a memory cell MC00 in FIG. 23.

FIG. 25 illustrates, in a table form, potential states of nodes N1 and N2 of each memory cell in the case where data of "1" is written into a plurality of memory cells shown in FIG. 23.

FIG. 26 illustrates, in a table form, potential states of nodes N1 and N2 of each memory cell in the case where data of "0" is written into the plurality of memory cells shown in FIG. 23.

FIG. 27 schematically shows a structure of a row predecoder included in a static semiconductor memory device of a fourth embodiment.

FIG. 28 illustrates changes in waveform of respective signals in the fourth embodiment.

FIG. 29 illustrates potential states of nodes N1 and N2 of each memory cell and the gates of access transistors A thereof in a fifth embodiment.

FIG. 30 is another diagram illustrating potential states of nodes N1 and N2 of each memory cell and the gates of access transistors A thereof in the fifth embodiment.

FIG. 31 is still another diagram illustrating potential states of nodes N1 and N2 of each memory cell and the gates of access transistors A thereof in the fifth embodiment.

FIG. 32 is further another diagram illustrating potential states of nodes N1 and N2 of each memory cell and the gates of access transistors A thereof in the fifth embodiment.

FIG. 34 illustrates changes in waveform of respective signals in the sixth embodiment.

DESCRIPTION OF THE PREFERRED EMBODIMENTS

Figure 1:
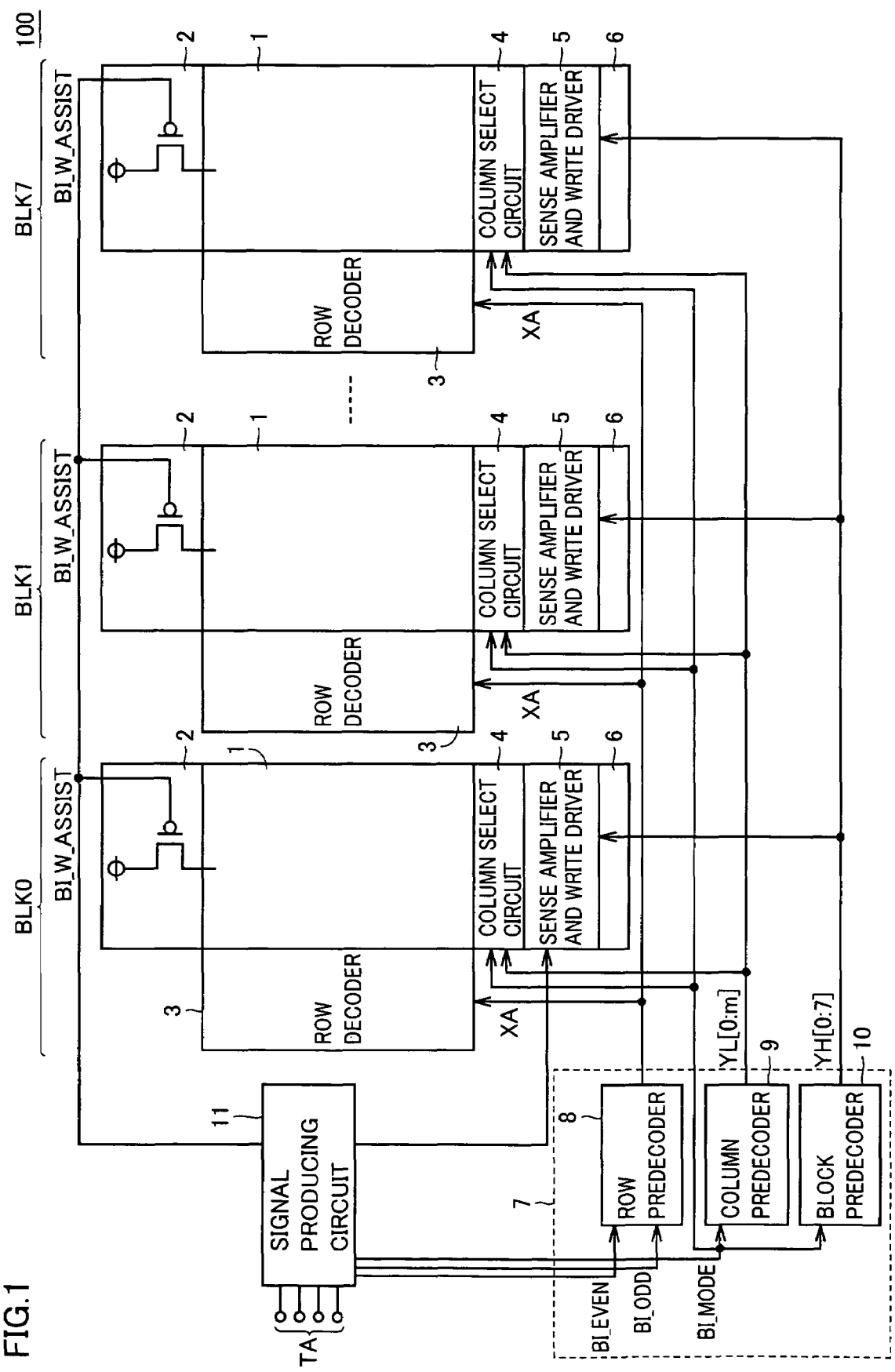
FIG. 1 shows a whole structure of a static semiconductor memory device of a first embodiment.

Embodiments of the invention will now be described with reference to the drawings. In the drawings, the same or corresponding portions bear the same reference numbers.

First Embodiment

FIG. 1 shows a whole structure of a static semiconductor memory device of a first embodiment. Referring to FIG. 1, a semiconductor memory device 100 includes memory blocks of n (n is a natural number) in number. As shown in FIG. 1, semiconductor memory device 100 includes, e.g., eight blocks BLK0-BLK7. These blocks BLK0-BLK7 have the same structure. Therefore, description will now be given on the structure of block BLK0, and description of the structures of the other memory blocks is not repeated.

Block BLK0 includes a memory cell array 1. Memory cell array 1 has a plurality of memory cells arranged in rows and columns, a plurality of word lines arranged corresponding to respective rows of the plurality of memory cells, and a plurality of bit line pairs arranged corresponding to respective columns of the plurality of memory cells. As will be described later, the memory cell has a storage node pair that statically holds complementary potentials when it is supplied with a power supply potential.

Block BLK0 further includes a power supply circuit 2 that selectively supplies and interrupts the power supply potential to each of the plurality of memory cells included in memory cell array 1. Power supply circuit 2 selectively supplies and interrupts the power supply potential to each of the plurality of memory cells according to a signal BI_W_ASSIST provided thereto. Signal BI_W_ASSIST corresponds to a "supply instruction signal" in the invention.

Block BLK0 further includes a row decoder 3 that decodes a signal XA to select each of the plurality of word lines, a column select circuit 4 that decodes signals YL[0]-YL[m] of (m+1) in number to select each of the plurality of bit line pairs, a sense amplifier and write driver block 5 and an input/output circuit 6. In FIG. 1, signals YL[0:m] generally represent signals YL[0]-YL[m]. Similarly to FIG. 1, signals YL[0:m] in the following description generally represent signals YL[0]-YL[m]. A signal XA is a row select signal, and signals YL[0:m] are column select signals.

In an operation of reading data from the memory cell, sense amplifier and write driver block 5 amplifies a minute potential difference occurring on a bit line pair to determine whether read data is "1" or "0". In a data write operation, sense amplifier and write driver block 5 applies the complementary potentials to the bit line pair according to the write data received from input/output circuit 6, and thereby writes the data into the memory cell.

The "power supply circuit" in the invention includes power supply circuits 2 of respective blocks BLK0-BLK7. A "row select circuit" in the present invention includes row decoders 3 of respective blocks BLK0-BLK7. The "column select circuit" in the invention includes column select circuits 4 of respective blocks BLK0-BLK7. The "write circuit" in the invention includes sense amplifier and write driver blocks 5 of respective blocks BLK0-BLK7.

Semiconductor memory device 100 further includes a control circuit 7. Control circuit 7 receives a signal BI_MODE for setting an operation mode of semiconductor memory device 100 to a test mode as well as signals (i.e., signals BI_ODD and BI_EVEN) for selecting selection targets, i.e., a plurality of word lines from among the plurality of word lines, and thereby selects at least one of the memory blocks. Control circuit 7 applies signals XA and YL[0:m] to the selected memory block(s).

In the first embodiment, control circuit 7 operates according to provided signals BI_MODE, BI_ODD and BI_EVEN, and thereby designates all blocks BLK0-BLK7 in a burn-in mode. In the burn-in mode, all the word lines and all the bit lines in each memory block are selected.

When signal BI_MODE is at an H-level (logical high), the operation mode of semiconductor memory device 100 is set to the burn-in mode. When signal BI_MODE is at an L-level (logical low), the operation mode of semiconductor memory device 100 is set to a normal operation mode.

Control circuit 7 includes a row predecoder 8, a column predecoder 9, a block predecoder 10 and a signal producing circuit 11.

In response to signal BI_EVEN at the H-level, row predecoder 8 provides signal XA that causes row decoder 3 included in each memory block to select a plurality of even-numbered word lines among the plurality of word lines. In response to signal BI_ODD at the H-level, row predecoder 8 provides signal XA that causes row decoder 3 included in each memory block to select a plurality of odd-numbered word lines among the plurality of word lines. When both signals BI_EVEN and BI_ODD are at the H-level, signal XA causes row decoder 3 to select the plurality of word lines as a unit.

It is not necessary that row predecoder 8 selects the plurality of even-numbered word lines or the plurality of odd-numbered word lines, and it is merely required to select, as a unit, a plurality of target word lines satisfying certain conditions from among the plurality of word lines according to signal XA (row select signal). The "unit" represents a set or group of the word lines that are selected during overlapping time periods, respectively.

Column predecoder 9 provides signals YL[0:m] according to signal BI_MODE. When signal BI_MODE is at the H-level, column select circuit 4 selects, as a unit, the plurality of columns in memory cell array 1 according to signals YL[0:m]. In this case, signals YL[0:m] (column select signals) correspond to signals that select, as a unit, the plurality of bit line pairs. This "unit" represents a set or group of the bit line pairs that are selected during overlapping time periods, respectively. When signal BI_MODE is at the L-level, column select circuit 4 selects one from the plurality of columns in memory cell array 1 according to signals YL[0:m].

Block predecoder 10 provides signals YH[0]-YH[7] according to signal BI_MODE. In FIG. 1, signals YH[0:7] generally represent signals YH[0]-YH[7]. Likewise, signals YH[0:7] in the following description generally represent signals YH[0]-YH[7].

When signal BI_MODE is at the H-level, sense amplifier and write driver blocks 5 included in each of blocks BLK0-BLK7 writes the data into the corresponding memory block according to signal YH[0:7]. When signal BI_MODE is at the L-level, only one of signals YH[0:7] (i.e., signals YH[0]-YH[7]) becomes active. In this case, sense amplifier and write driver block 5 included in the memory block receiving this active signal writes the data into the corresponding memory block.

Signal producing circuit 11 has an input terminal TA for receiving an externally applied signal. Signal producing circuit 11 provides signals BI_W_ASSIST, BI_EVEN, BI_ODD and BI_MODE according to the received signal. Signal producing circuit 11 transmits the signal to sense amplifier and write driver block 5. The signal transmitted from signal producing circuit 11 to sense amplifier and write driver block 5 will be described later.

It is not necessary that the static semiconductor memory device of the invention can be applied only to a general-purpose semiconductor memory. The static semiconductor memory device of the invention may be included, e.g., in an SoC (System-on Chip), a microcomputer or a microprocessor.

Figure 2:
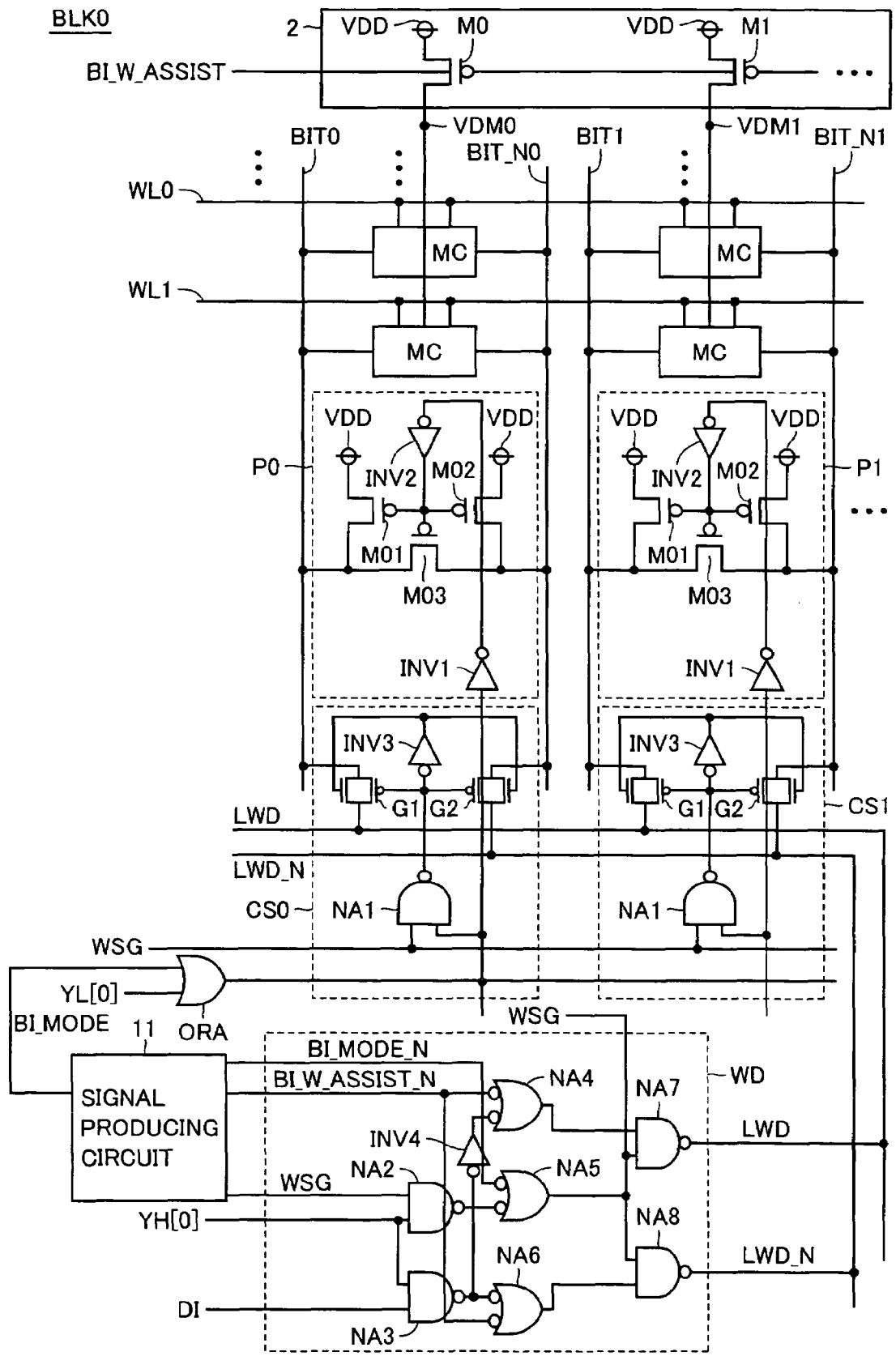
FIG. 2 shows a structure of a major portion of a block BLK0 in FIG. 1.

FIG. 2 shows a structure of a major portion of block BLK0 in FIG. 1. Referring to FIG. 2, block BLK0 includes a plurality of memory cells MC arranged in rows and columns. FIG. 2 shows four memory cells MC arranged in two rows and two columns among the plurality of memory cells MC.

Block BLK0 further includes the plurality of word lines arranged corresponding to the respective rows of the plurality of memory cells as well as the plurality of bit line pairs arranged corresponding to the respective columns of the plurality of memory cells. FIG. 2 shows word lines WL0 and WL1, a bit line pair BIT0 and BIT_N0, and a bit line pair BIT1 and BIT_N1. "Bit line pair BIT0 and BIT_N0" represents the bit line pair formed of bit lines BIT0 and BIT_N0.

Block BLK0 includes power supply circuit 2. Power supply circuit 2 includes a plurality of P-channel MOS transistors arranged corresponding to the plurality of bit line pairs, respectively. FIG. 2 shows P-channel MOS transistors M0 and M1. P-channel MOS transistor M0 has one end connected to a power supply node VDD and the other end connected to a node VDM0, and receives signal BI_W_ASSIST on its gate. P-channel MOS transistor M1 has one end connected to power supply node VDD and the other end connected to a node VDM1, and receives signal BI_W_ASSIST on its gate. It is not necessary that the P-channel MOS transistors included in power supply circuit 2 are arranged corresponding to the plurality of bit line pairs, respectively, and each transistor may be arranged corresponding to, e.g., two bit line pairs (i.e., two columns in the memory cell array).

Block BLK0 further includes an OR circuit ORA receiving signals BI_MODE and YL[0] on one and the other of its input terminals, respectively. In the burn-in mode, signal BI_MODE is at the H-level. Therefore, OR circuit ORA provides a signal at the H-level independently of the level of signal YL[0].

OR circuit ORA is provided for each of signals YL[0]-YL[7]. Each OR circuit receives corresponding one of signals YL[0]-YL[7] on one of its terminals, and also receives signal BI_MODE on the other input terminal. Each OR circuit provides its output to an NAND circuit NA1 included in the column select circuit. For the sake or simplicity, FIG. 2 shows OR circuit ORA receiving signals YL[0] and BI_MODE.

Block BLK0 further includes a plurality of precharge/equalize circuits arranged corresponding to the plurality of bit line pairs, respectively. FIG. 2 shows precharge/equalize circuits P0 and P1 corresponding to bit line pairs BIT0 and BIT_N0, and bit line pairs BIT1 and BIT_N1.

Each of precharge/equalize circuits P0 and P1 includes an inverter INV1 inverting the output of OR circuit ORA, an inverter INV2 inverting the output of inverter INV1, and P-channel MOS transistors M01-M03 each receiving on its gate the output of inverter INV2. One of ends of P-channel MOS transistor M01 is connected to power supply node VDD, and the other end is connected to a bit line BIT. One of ends of P-channel MOS transistor M02 is connected to power supply node VDD, and the other end is connected to a bit line BIT_N. One of ends of P-channel MOS transistor M03 is connected to bit line BIT, and the other end is connected to bit line BIT_N.

Block BLK0 further includes column select circuits CS0 and CS1 arranged corresponding to bit line pairs BIT0 and BIT_N0, and BIT1 and BIT_N1, respectively.

Each of column select circuits CS0 and CS1 includes NAND circuit NA1, an inverter INV3 and transmission gates G1 and G2. NAND circuit NA1 receives a write instruction signal WSG on one of its input terminals, and receives the output of OR circuit ORA on the other input terminal. Inverter INV3 inverts the output of NAND circuit NA1. Transmission gate G1 is connected between bit line BIT and a data line LWD, receives the outputs of NAND circuit NA1 and inverter INV3, and thereby attains the open or closed state.

Block BLK0 further includes a plurality of data line pairs each arranged for a predetermined number of bit line pairs among the plurality of bit line pairs. For example, each data line pair is arranged for the four bit line pairs among the plurality of bit line pairs included in memory cell array 1.

FIG. 2 representatively shows one data line pair formed of data lines LWD and LWD_N among the plurality of data line pairs. Data line LWD is commonly connected to the first bit lines (i.e., bit line BIT0, BIT1 and the like in FIG. 2) of the corresponding bit line pairs. Data line LWD_N is commonly connected to the second bit lines (i.e., bit line BIT_N0, BIT_N1 and the like in FIG. 2) of the corresponding bit line pairs.

Block BLK0 further includes a plurality of write drivers (write circuits) WD arranged corresponding to the plurality of data line pairs, respectively. Write drivers WD are included in sense amplifier and write driver block 5 in FIG. 1.

Write driver WD includes NAND circuits NA2 and NA3. NAND circuit NA2 receives write instruction signal WSG on one of its input terminals, and receives signal YH[0] on the other input terminal. NAND circuit NA3 receives signal YH[0] on one of its input terminals, and receives a data signal DI on the other input terminal. Data signal DI is provided via input/output circuit 6 to NAND circuit NA3. Data signal DI represents data to be written into memory cell MC.

Write driver WD further includes an inverter INV4 inverting the output of NAND circuit NA3 as well as NAND circuits NA4-NA8. NAND circuit NA4 receives a signal BI_W_ASSIST_N on one of its input terminals, and receives the output of inverter INV4 on the other input terminal. Signal BI_W_ASSIST_N is an inverted signal of signal BI_W_ASSIST.

NAND circuit NA5 receives a signal BI_MODE_N on one of its input terminals, and receives the output of NAND circuit NA2 on the other input terminal. Signal BI_MODE_N is an inverted signal of signal BI_MODE. NAND circuit NA6 receives the output of NAND circuit NA5 on one of its input terminals, and receives signal BI_W_ASSIST_N on the other input terminal.

NAND circuit NA7 receives the output of NAND circuit NA4 on one of its input terminals, and receives write instruction signal WSG on the other input terminal. NAND circuit NA8 receives write instruction signal WSG on one of its input terminals, and receives the output of NAND circuit NA6 on the other input terminal. NAND circuit NA7 provides its output to data line LWD, and NAND circuit NA8 provides its output to data line LWD_N.

Signal producing circuit 11 provides signals BI_MODE and BI_W_ASSIST as well as signals BI_MODE_N and BI_W_ASSIST_N. Further, signal producing circuit 11 provides write instruction signal WSG in the data write operation.

Figure 3:
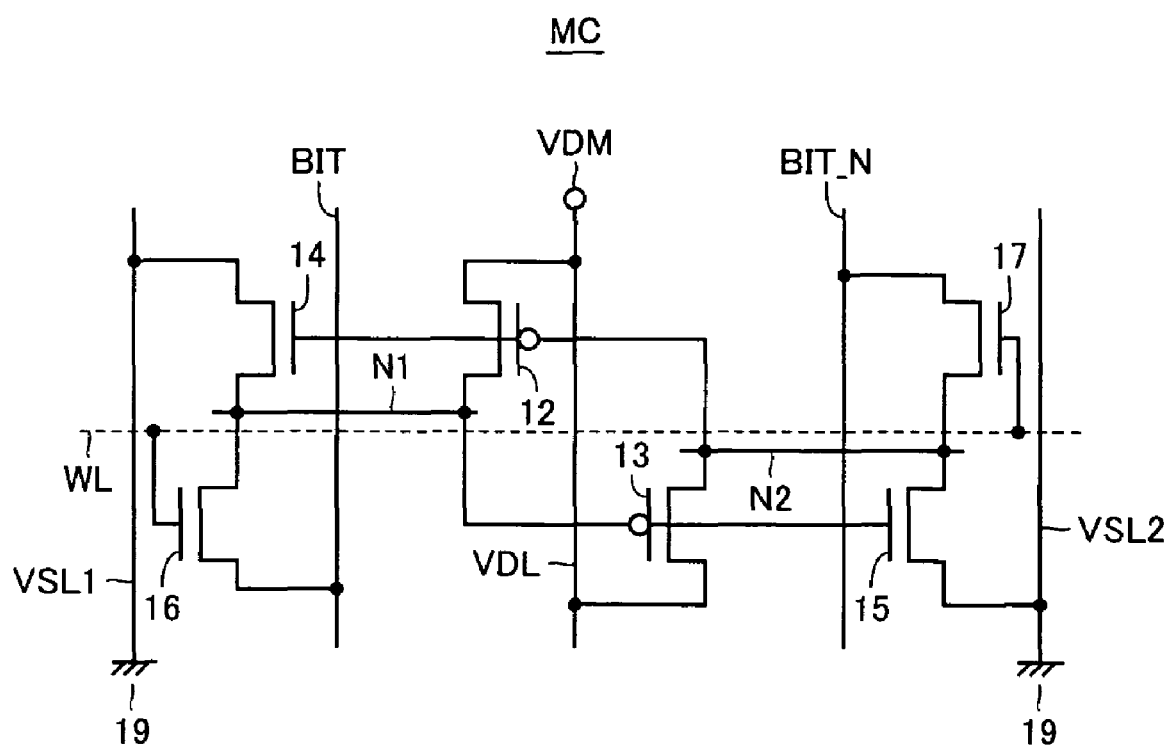
FIG. 3 is a circuit diagram of a memory cell MC shown in FIG. 2.

FIG. 3 is a circuit diagram of memory cell MC shown in FIG. 2. Referring to FIG. 3, memory cell MC includes P-channel MOS transistors 12 and 13, N-channel MOS transistors 14-17 and nodes N1 and N2, which are storage nodes.

P-channel MOS transistor 12 has one end connected to a power supply line VDL, the other end connected to a gate terminal of P-channel MOS transistor 13 and a gate terminal connected to the other end of P-channel MOS transistor 13.

P-channel MOS transistor 13 has one end connected to power supply line VDL, the other end connected to a gate terminal of P-channel MOS transistor 12 and a gate terminal connected to the other end of P-channel MOS transistor 12.

N-channel MOS transistor 14 has one end connected to a ground line VSL1, the other end connected to the other end of N-channel MOS transistor 16 and a gate terminal connected to the other end of P-channel MOS transistor 13.

N-channel MOS transistor 15 has one end connected to a ground line VSL2, the other end connected to the other end of N-channel MOS transistor 17 and a gate terminal connected to the other end of P-channel MOS transistor 12.

N-channel MOS transistor 16 has one end connected to bit line BIT, the other end connected to the other end of N-channel MOS transistor 14 and a gate terminal connected to word line WL.

N-channel MOS transistor 17 has one end connected to bit line BIT_N, the other end connected to the other end of N-channel MOS transistor 15 and a gate terminal connected to word line WL.

The other ends of P-channel MOS transistor 12 and N-channel MOS transistors 14 and 16 are connected together to form node N1, and the other ends of P-channel MOS transistor 13 and N-channel MOS transistor 15 and 17 are connected together to form node N2.

P-channel MOS transistor 12 is turned off when node N2 attains the H-level. When node N2 attains the L-level, P-channel MOS transistor 12 is turned on to supply the power supply potential from a node VDM via power supply line VDL to node N1, and thus sets node N1 to the H-level. P-channel MOS transistor 13 is turned off when node N1 attains the H-level. When node N1 attains the L-level, P-channel MOS transistor 13 is turned on to supply the power supply potential from node VDM via power supply line VDL to node N2, and thus sets node N2 to the H-level.

As described above, P-channel MOS transistors 12 and 13 supply the power supply voltage from node VDM to nodes N1 and N2 according to the potential states of nodes N2 and N1, and therefore are referred to as "load transistors", respectively.

N-channel MOS transistor 14 is turned on when node N2 attains the H-level, and thereby supplies the charges on node N1 via ground line VSL1 to a ground node 19 to set node N1 to the L-level. When node N2 attains the L-level, the N-channel MOS transistor 14 is turned off to hold charges on node N1. When node N1 attains the H-level, N-channel MOS transistor 15 is turned on to supply charges on node N2 via ground line VSL2 to ground node 19, and thereby sets node N2 to the L-level. When node N1 attains the L-level, N-channel MOS transistor 15 is turned off to hold charges on node N2.

As described above, N-channel MOS transistors 14 and 15 supply the charges on nodes N1 and N2 to ground node 19, or hold the charges on nodes N1 and N2 according to the potential states of nodes N1 and N2, and therefore are referred to as "driver transistors".

N-channel MOS transistor 16 is turned on to supply charges on bit line BIT to node N1 when word line WL is selected. When word line WL is not selected, N-channel MOS transistor 16 stops transmission of charges between bit line BIT and node N1. N-channel MOS transistor 17 is turned on to supply charges on bit line BIT_N to node N2 when word line WL is selected. When word line WL is not selected, N-channel MOS transistor 17 stops transmission of charges between bit line BIT_N and node N2.

As described above, each of N-channel MOS transistors 16 and 17 transmits the charges via word line WL between node N1 and bit line BIT or between node N2 and bit line BIT_N, and therefore is referred to as an access transistor.

When data "1" is written, nodes N1 and N2 attain the H- and L-levels, respectively. When data "0" is written, nodes N1 and N2 attain the L- and H-levels, respectively.

Figure 4:
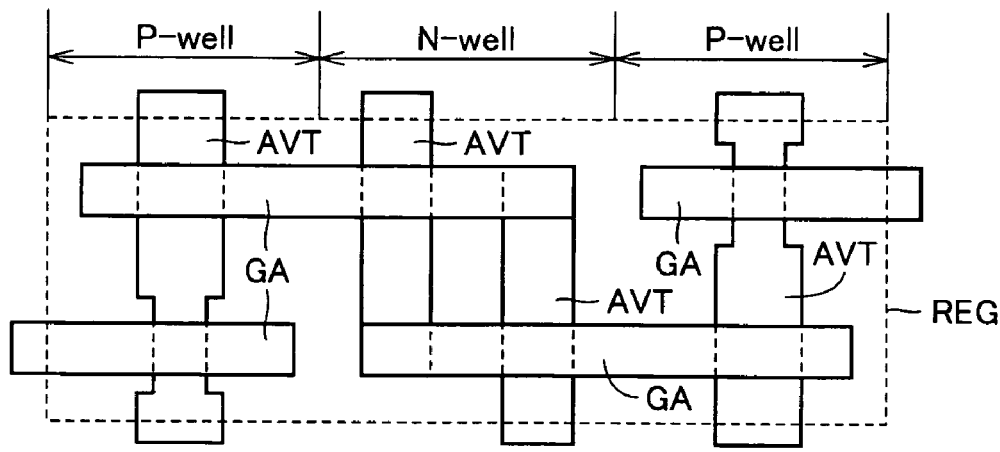
FIG. 4 shows a lowermost layer (A) of memory cell MC.

Referring to FIGS. 4-9, description will now be given on formation of memory cell MC. Referring to FIG. 4, memory cell MC is formed at a region REG. FIG. 4 shows a lowermost layer (A) of memory cell MC. Active layers AVT are formed at two P-wells, respectively, and two active layers AVT are formed at an N-well. Four gate electrodes GA are formed perpendicularly to four active layers AVT.

Figure 5:
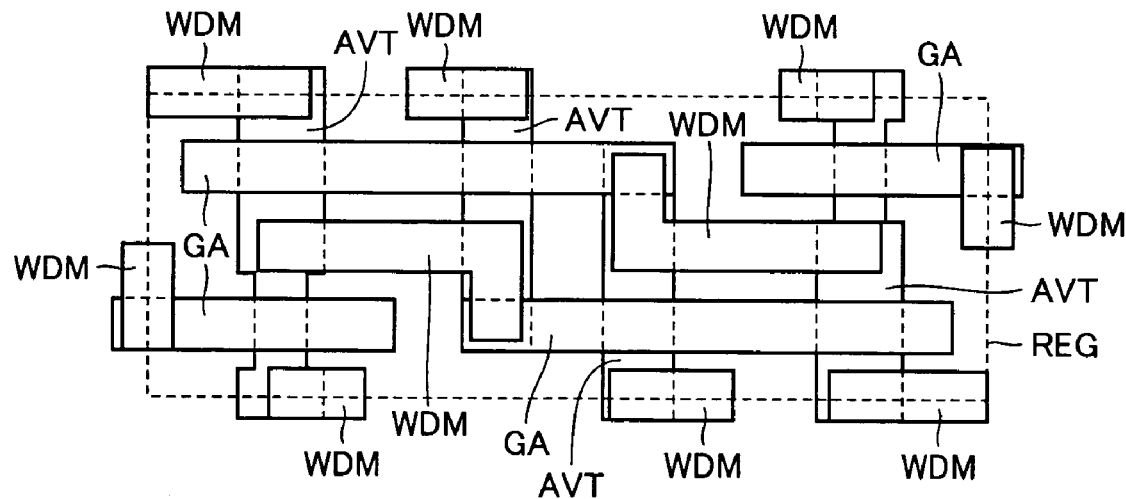
FIG. 5 is a plan of a layer (B) formed on the lowermost layer (A) shown in FIG. 4.

Referring to FIG. 5, description will now be given on a layer (B) formed on lowermost layer (A). Ten tungsten damascenes WDM are formed at region REG of memory cell MC.

Figure 6:
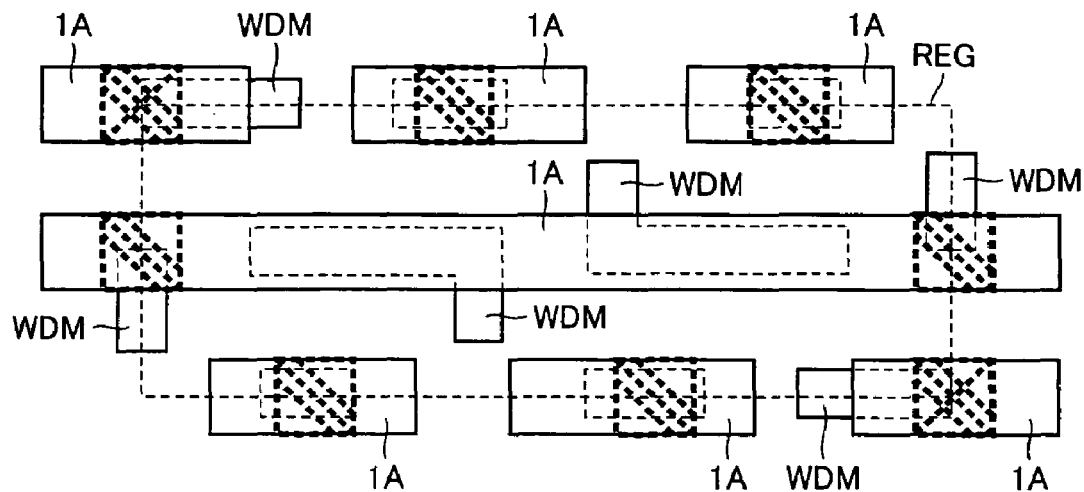
FIG. 6 is a plan of a layer (C) formed on the layer (B) shown in FIG. 5.

Referring to FIG. 6, description will now be given on a layer (C) formed on layer (B). Aluminum interconnection layers 1A are formed as a first layer to cover substantially ten tungsten damascenes WDM formed at layer (B). Word line WL is formed of aluminum interconnection 1A that extends laterally and is located substantially at a vertical center of region REG.

Figure 7:
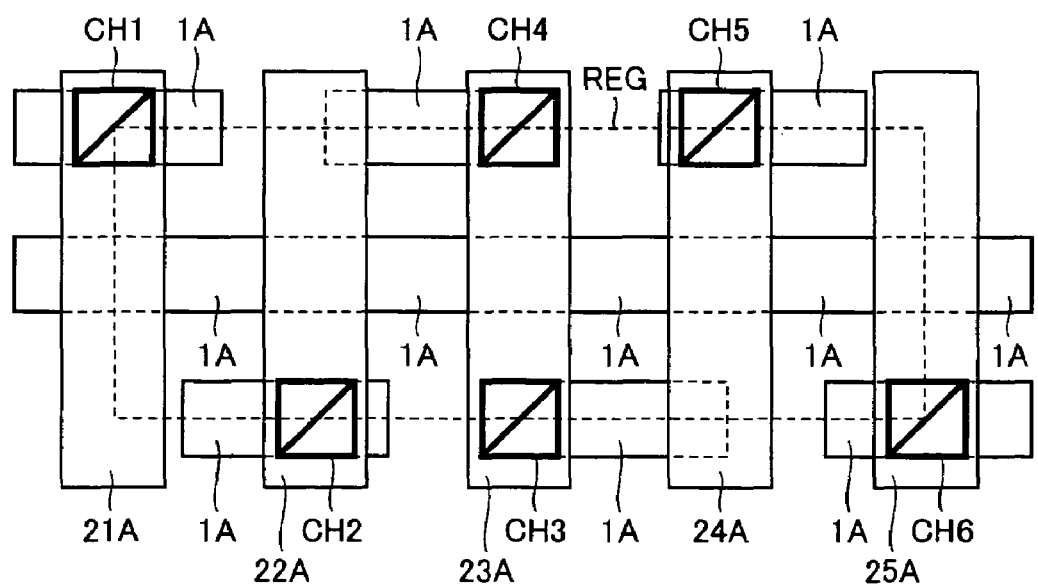
FIG. 7 is a plan of a layer (D) formed on the layer (C) shown in FIG. 6.

Referring to FIG. 7, a layer (D) formed on layer (C) will now be described. Aluminum interconnections 21A-25A forming a second layer extend perpendicularly to aluminum interconnections 1A of the first layer formed at layer (C). Aluminum interconnection 21A of the second layer is ground line VSL1, aluminum interconnection 22A of the second layer is bit line BIT, aluminum interconnection 23A of the second layer is power supply line VDL, aluminum interconnection 24A of the second layer is bit line BIT_N and aluminum interconnection 25A of the second layer is ground line VSL2.

A contact hole CH1 connects aluminum interconnection 21A of the second layer serving as ground line VSL1 to aluminum interconnection 1A of the first layer. A contact hole CH2 connects aluminum interconnection 22A of the second layer serving as bit line BIT to aluminum interconnection 1A of the first layer. Contact holes CH3 and CH4 connect aluminum interconnection 23A of the second layer serving as power supply line VDL to aluminum interconnection 1A of the first layer. A contact hole CH5 connects aluminum interconnection 24A of the second layer serving as bit line BIT_N to aluminum interconnection 1A of the first layer. A contact hole CH6 connects aluminum interconnection 25A of the second layer serving as ground line VSL2 to aluminum interconnection 1A of the first layer.

In this case, aluminum interconnections 21A-25A of the second layer are spaced by a distance of about 0.3 μm from each other.

Figure 8:
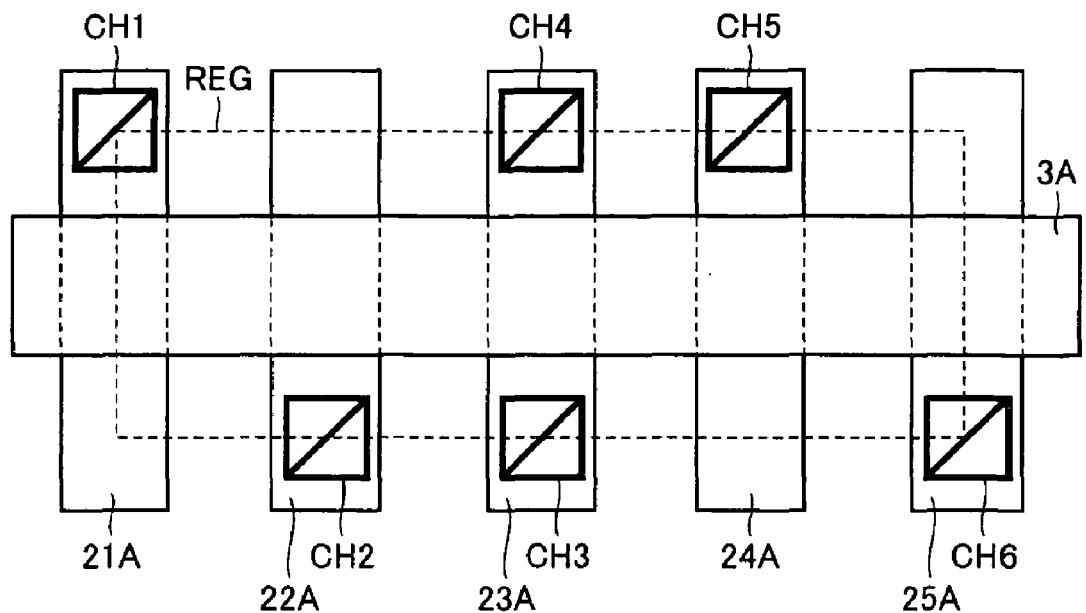
FIG. 8 is a plan of a layer (E) formed on the layer (D) shown in FIG. 7.

Referring to FIG. 8, description will now be given on a layer (E) formed on layer (D). An aluminum interconnection 3A of a third layer is formed perpendicularly to aluminum interconnections 21A-25A of the second layer.

Figure 9:
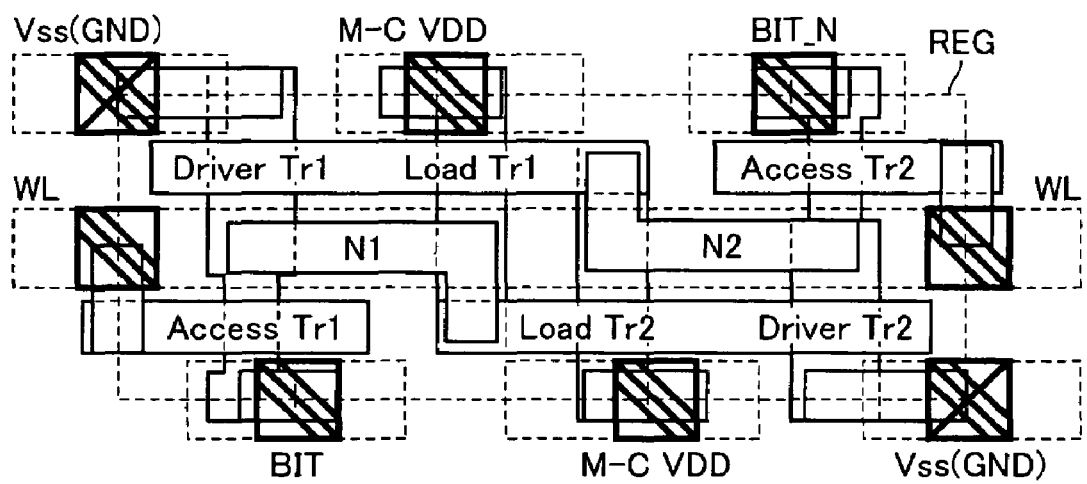
FIG. 9 is a plan of a static random access memory.

Layers (A)-(E) shown in FIGS. 4-8 are successively overlaid to form memory cell MC shown in FIG. 9. Referring to FIG. 9, "Load Tr1", "Driver Tr1" and "Access Tr1" are P-, N- and N-channel MOS transistors 12, 14 and 16 shown in FIG. 9, respectively. "Load Tr2", "Driver Tr2" and "Access Tr2" are P-, N- and N-channel MOS transistors 13, 15 and 17 shown in FIG. 9, respectively.

Description will now be given on a write operation for the memory cells in a burn-in mode.

Figure 10:
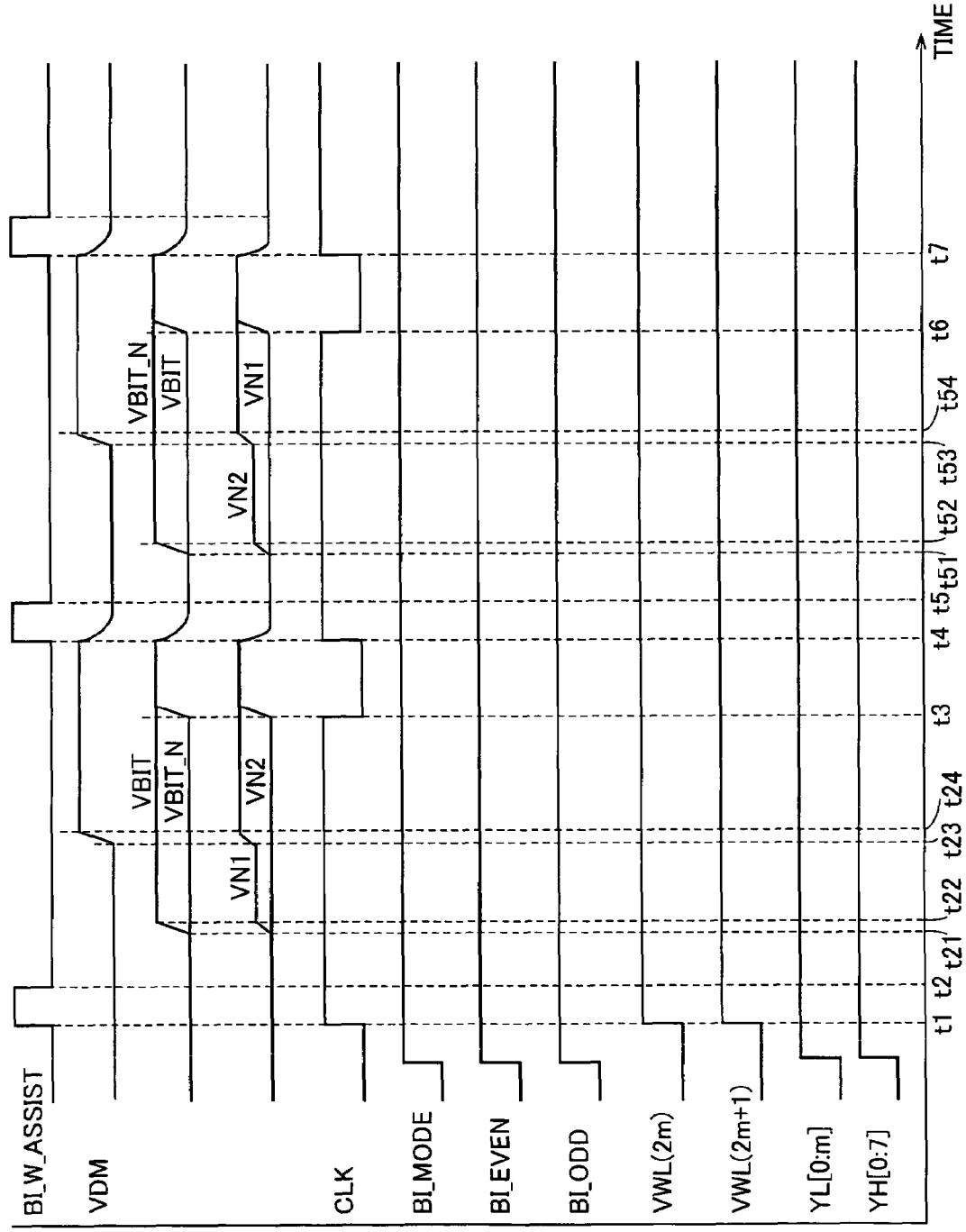
FIG. 10 is a timing chart illustrating respective signals in a write operation.

FIG. 10 is a timing chart illustrating signals for the write operation. Referring to FIGS. 2 and 10, signal BI_MODE changes to the H-level before a time t1 for setting the operation mode of semiconductor memory device 100 to the burn-in mode. Before time t1, all signals BI_EVEN, BI_ODD, YL[0:m] and YH[0:7] change to the H-level. Accordingly, the memory cells included in all the memory blocks become the data write target cells. Although not shown in FIG. 10, write instruction signal WSG is at the H-level indicating the data writing.

NAND circuit NA1 included in each of column select circuits CS0 and CS1 receives the signal at the H-level from OR circuit ORA, and also receives write instruction signal WSG at the H-level. Accordingly, NAND circuit NA1 provides the signal at the L-level, and inverter INV3 provides the signal at the H-level. Since both transmission gates G1 and G2 open, each of bit lines BIT0 and BIT1 is connected to data line LWD, and each of bit lines BIT_N0 and BIT_N1 is connected to data line LWD_N.

In each of precharge/equalize circuits P0 and P1, inverter INV1 receives the signal at the H-level from OR circuit ORA, and provides a signal at the L-level. Therefore, inverter INV2 provides a signal at the H-level according to the signal at the L-level provided from inverter INV1. Each of P-channel MOS transistors M01-M03 is turned off.

At time t1, external clock CLK changes to the H-level. At time t1, signals BI_EVEN and BI_ODD are both at the H-level. Therefore, row predecoder 8 and row decoder 3 select the plurality of word lines as a unit. A potential VWL (2m) indicates the potential of one of the plurality of even-numbered word lines. A potential VWL(2m+1) indicates the potential of one of the plurality of odd-numbered word lines. At and after time t1, both potentials VWL(2m) and VWL(2m+1) attain the H-level.

At time t1, signals YL[0:m] are at the H-level so that column predecoder 9 and column select circuit 4 select the plurality of bit line pairs as a unit in each memory block. Further, signals YH[0:7] are at the H-level at time t1 so that the plurality of memory blocks are selected at a time.

At time t1, signal BI_W_ASSIST attains the H-level. The fact that signal BI_W_ASSIST attains the H-level represents that the supply instruction signal becomes inactive in the invention. At time t1, since each of P-channel MOS transistors M0 and M1 is turned off, power supply node VDD is disconnected from node VDM0, and is also disconnected from node VDM1.

Since signal BI_W_ASSIST_N is at the L-level, each of NAND circuits NA4 and NA6 provides the signal at the H-level. Therefore, each of NAND circuits NA7 and NA8 provides the signal at the L-level.

Between times t1 and t2, signal BI_W_ASSIST is at the H-level. Therefore, the potential state of each of bit lines BIT0, BIT_N0, BIT1 and BIT_N1 attains at the L-level. The L-level means the potential state in which the potential is substantially equal to or lower than the threshold voltage (e.g., of about 0.3 V to 0.7 V) of the N-channel MOS transistor forming the memory cell. In FIG. 10, potentials VBIT and VBIT_N represent the potentials of bit lines BIT0 and BIT_N0, respectively. In FIG. 10, potentials VN1 and VN2 represent the potentials of nodes N1 and N2 shown in FIG. 3, respectively. Bit lines BIT and BIT_N in FIG. 3 are bit lines BIT0 and BIT_N0 in FIG. 2, respectively. Between times t1 and t2, potentials VBIT and VBIT_N are at the L-level. Therefore, both potentials VN1 and VN2 are at the L-level. The period between times t1 and t2 is appropriately determined within a range, e.g., from 10 ns to 100 ns.

As described above, write driver WD can change the potential states of both the two bit lines included in the bit line pair to the L-level in accordance with the change of corresponding signal BI_W_ASSIST_N to the L-level. In the static semiconductor memory device of the invention, therefore, the potential states of the two bit lines can be changed to the L-level (inactive state) by changing signal BI_W_ASSIST from the L-level to the H-level, i.e., from the active state to the inactive state.

At time t2, data "1" is written into all the memory cells. At time t2, data signal DI is at the H-level indicating the data of "1". Assuming that the power supply potential is VDD, and the threshold voltage of the P-channel MOS transistor forming the memory cell is Vth, the H-level substantially represents the potential state of (VDD−|Vth|).

At time t2, signal BI_W_ASSIST changes from the H-level to the L-level so that each of P-channel MOS transistors M0 and M1 is turned on. Power supply node VDD is connected to node VDM0, and is also connected to node VDM1. Therefore, the potentials of nodes VDM0 and VDM1 rise to the power supply potential. In this description, potential VDM represents the potential of node VDM0. The potential VDM is at the ground potential level before a time t23. At time t23, it starts to rise, and will attain the power supply potential level at a time t24.

After time t1, data signal DI, write instruction signal WSG and signals YH[0:7] are all at the H-level so that NAND circuits NA2 and NA3 provide the signal at the L-level. Inverter INV4 receives the signal at the L-level from NAND circuit NA2, and provides the signal at the H-level. NAND circuit NA4 receives the signal at the H-level provided from inverter INV4 as well as signal BI_W_ASSIST_N at the H-level, and provides the signal at the L-level. NAND circuit NA5 receives signal BI_MODE_N at the L-level as well as the signal at the L-level provided from NAND circuit NA2, and provides the signal at the H-level. NAND circuit NA6 receives the signal at the L-level provided from NAND circuit NA3 as well as signal BI_W_ASSIST_N at the H-level, and provides the signal at the H-level.

NAND circuit NA7 receives the signal at the L-level provided from NAND circuit NA4 as well as write instruction signal WSG at the H-level, and provides the signal at the H-level to data line LWD. NAND circuit NA8 receives the signal at the H-level provided from NAND circuit NA6 as well as write instruction signal WSG at the H-level, and provides the signal at the L-level to data line LWD_N. Therefore, the potential state of each of bit lines BIT0 and BIT1 attains the level of power supply potential VDD (which will be referred to as the "H-level" hereinafter), and the potential state of each of bit lines BIT_N0 and BIT_N1 attains the ground potential level (which will be referred to as the "L-level" hereinafter).

As shown in FIG. 10, potential VBIT starts to rise at a time t21, and attains the H-level (active level) at a time t22. In response to the change in potential VBIT, potential VN1 starts to rise at time t21, and attains a certain potential at time t22. Between times t21 and t22, potential VBIT_N is at the L-level (inactive level).

As described above, potential VN1 further rises in response to the rising of potential VDM after time t23. At time t24, potential VN1 attains the power supply potential and thus the H-level. Between times t22 and t3, potential VN1 holds the H-level. Between times t2 and t3, potential VBIT_N keeps the L-level without any change so that potential VN2 keeps the L-level without any change between times t2 and t3.

Before time t3, external clock CLK changes from the H-level to the L-level. Between times t3 and t4, external clock CLK is at the L-level. Thereby, the plurality of word lines and the plurality of bit line pairs included in all the blocks are in the unselected state. The period between times t3 and t4 is, e.g., several hundreds of nanoseconds.

The period between times t3 and t4 corresponds to the precharge period of the bit line pair. During this period, inverter INV1 shown in FIG. 2 is supplied with the precharge signal (not shown) at the L-level. Thereby, P-channel MOS transistors M01-M03 are turned on to set the potentials of bit lines BIT0, BIT_N0, BIT1 and BIT_N1 to the power supply potential level. Accordingly, both potentials VBIT and VBIT_N are at the power supply potential level (H-level) during a period between times t3 and t4 as illustrated in FIG. 10. Thereby, potentials VN1 and VN2 are at the power supply potential level (H-level) during a period between times t3 and t4.

At time t4, external clock CLK changes from the L-level to the H-level. At time t4, signal BI_W_ASSIST changes to the H-level similarly to time t1. When signal BI_W_ASSIST changes to the H-level, P-channel MOS transistor M0 is turned off so that potential VDM of node VDM0 changes to the potential lower than the power supply potential. In response to the change of signal BI_W_ASSIST_N to the L-level, write driver WD changes the potential states of both the two bit lines included in the bit line pair to the L-level. Accordingly, both potentials VBIT and VBIT_N change from the L-level to the H-level during the period between times t4 and t5. Thereby, potentials VN1 and VN2 change from the H-level (active state) to the L-level (inactive state).

A period between times t4 and t5 corresponds to the period of the inactive state of signal BI_W_ASSIST. During this period, both the potentials (VN1 and VN2) of the storage node pair of the memory cell are initialized to the inactive state.

Other operations of semiconductor memory device 100 between times t4 and t5 are the same as those between times t1 and t2, and therefore description thereof is not repeated.

At and after time t5, data "0" is written into all the memory cells. At time t5, data signal DI is in the state of the H-level representing the data of "0". At time t5, signal BI_W_ASSIST changes from the H-level to the L-level so that P-channel MOS transistors M0 and M1 are turned on. Thereby, power supply node VDD is connected to node VDM0, and is also connected to node VDM1.

The operation of write driver WD for writing the data "1" differs from that for writing the data "0" in that the logical level of the output of each of NAND circuits NA2 and NA5 does not change when writing the data "0". Therefore, NAND circuit NA2 provides the signal at the L-level, and NAND circuit NA5 provides the signal at the H-level.

In the operation of writing the data "0", the logical level of each of the outputs of NAND circuits NA3, NA4, NA6, NA7 and NA8 as well as inverter INV4 changes in contrast to the operation of writing the data "1".

NAND circuit NA3 provides the signal at the H-level in response to the change of data signal DI to the L-level. Inverter INV4 provides the signal at the L-level in response to the signal at the H-level received from NAND circuit NA3.

In response to the reception of the signal at the L-level from inverter INV4, NAND circuit NA4 changes its output signal from the L-level to the H-level. In response to the reception of the signal at the H-level from NAND circuit NA3, NAND circuit NA6 changes its output signal from the H-level to the L-level.

In response to the change of the output of NAND circuit NA4 from the L-level to the H-level, NAND circuit NA7 changes its output signal to be provided to data line LWD from the H-level to the L-level. In response to the change of the output of NAND circuit NA6 from the H-level to the L-level, NAND circuit NA8 changes its output signal to be provided to data line LWD_N from the H-level to the H-level. Thereby, each of bit lines BIT0 and BIT1 bears the potential at the L-level, and each of bit lines BIT_N0 and BIT_N1 bears the potential at the H-level.

The changes of potentials VBIT and VBIT_N during the period between times t2 and t4 are the same as those of potentials VBIT_N and VBIT during the period between times t5 and t7, respectively. The changes of potentials VN1 and VN2 during the period between times t2 and t4 are the same as those of potentials VN2 and VN1 during the period between times t5 and t7, respectively. Thus, potentials VBIT, VBIT_N, VN1 and VN2 at each of times t51-t54 are the same as potentials VBIT_N, VBIT, VN2 and VN1 at each of times t21-t24, respectively.

Figure 11:
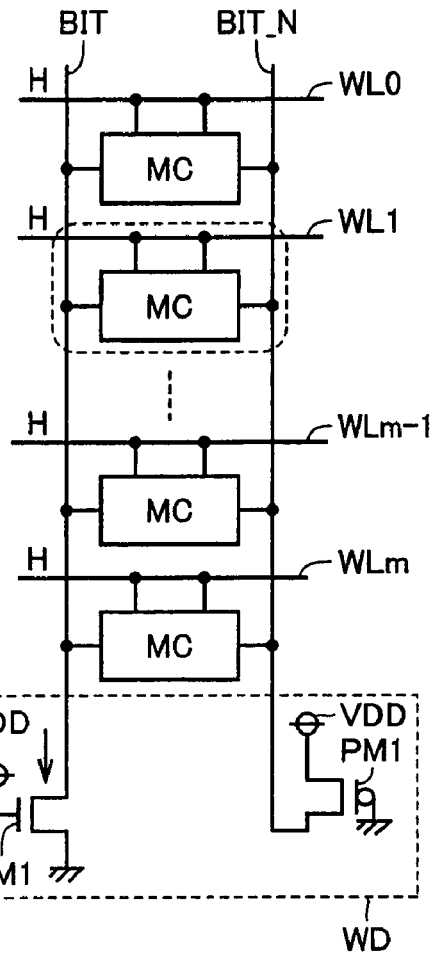
FIG. 11 illustrates a problem caused when writing is effected on a plurality of memory cells in an ordinary static semiconductor memory device.

FIG. 11 illustrates a problem caused when data is written into a plurality of memory cells in a conventional static semiconductor memory device. FIG. 11 representatively shows memory cells MC belonging to the column corresponding to bit line pair BIT and BIT_N.

In FIG. 11, each memory cell MC has stores data of "1". It is assumed the data of "0" is to be written into each memory cell MC. N-channel MOS transistor NM1 and P-channel MOS transistor PM1 equivalently represent write driver WD in the data write operation. N-channel MOS transistor NM1 has a gate connected to power supply node VDD, one end connected to bit line BIT and the other end connected to the ground node. P-channel MOS transistor PM1 has a gate connected to the ground node, one end connected to bit line BIT_N and the other end connected to power supply node VDD. In the data write operation, therefore, N- and P-channel MOS transistors NM1 and PM1 are both on.

For applying a stress to memory cells MC, it is preferable that the data is written into memory cells MC while keeping the potentials of word lines WL0-WLm at the H-level so that maximum potential differences may occur between paired bit lines BIT and BIT_N as well as between nodes N1 and N2 of memory cell MC.

However, when it is attempted in the full CMOS-SRAM to apply the stress to memory cells MC by simultaneously raising many word lines and performing the write operation thereon, the current capability of the N-channel MOS transistor NM1 included in write driver WD becomes small with respect to the total of the current capability of the load transistors (P-channel MOS transistors 12) of the plurality of memory cells MC so that it is difficult in the full CMOS-SDRAM to write simultaneously the data into the plurality of memory cells MC.

Figure 12:
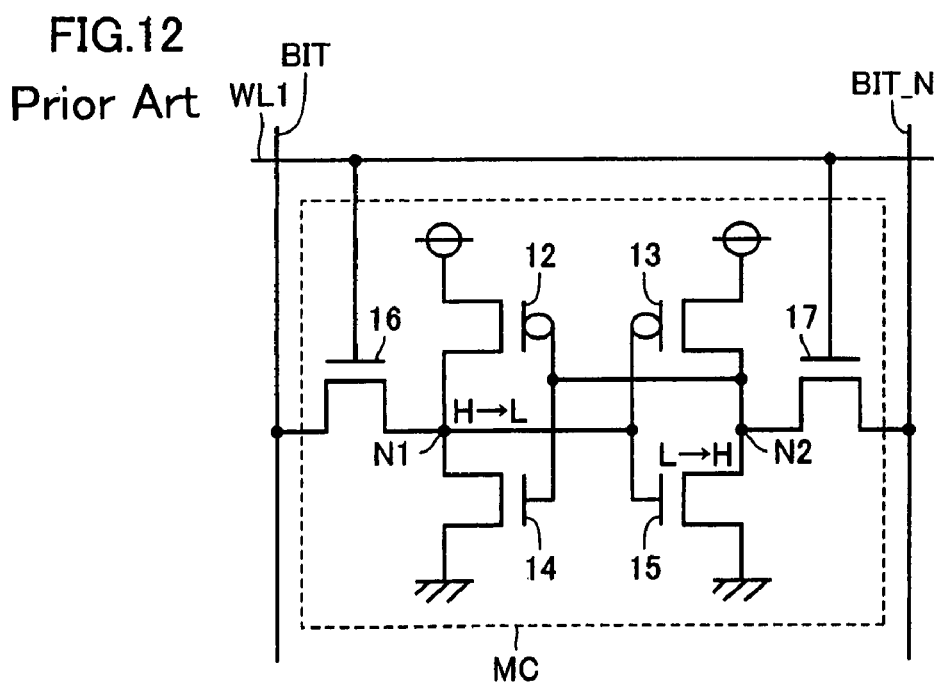
FIG. 12 illustrates changes in potential level of storage nodes of the memory cell shown in FIG. 11.

FIG. 12 illustrates the changes in potential level of the storage nodes of the memory cell shown in FIG. 11. Referring to FIG. 12, when a write state continues in spite of the fact that the data stored in memory cell MC does not change, nodes N1 and N2 are kept at the potential state intermediate between the H- and L-levels. In this case, through-currents flow within the CMOS circuit formed of P- and N-channel MOS transistors 12 and 14, and within the CMOS inverter circuit formed of P- and N-channel MOS transistors 13 and 15. When the through-currents flow in all the memory cells, a very large current flows in the semiconductor memory device as a whole.

Figure 13:
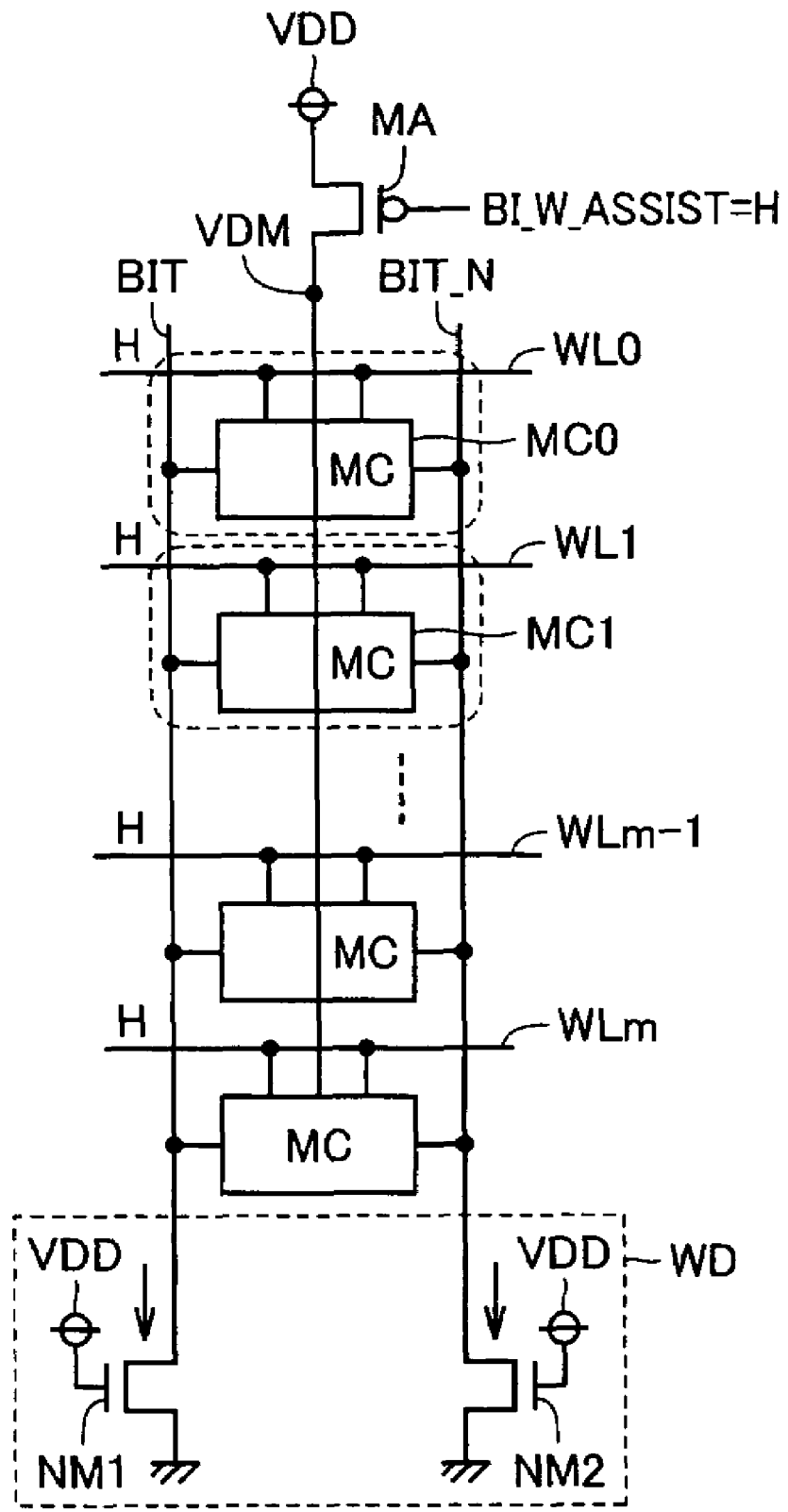
FIG. 13 shows a state before writing into the plurality of memory cells in the static semiconductor memory device according to the invention.

FIG. 13 illustrates a state attained in the static semiconductor memory device of the invention before data is written into the plurality of memory cells. Referring to FIG. 13, it is assumed that memory cells MC0 and MC1 stored data of "1" and "0", respectively.

Figure 14:
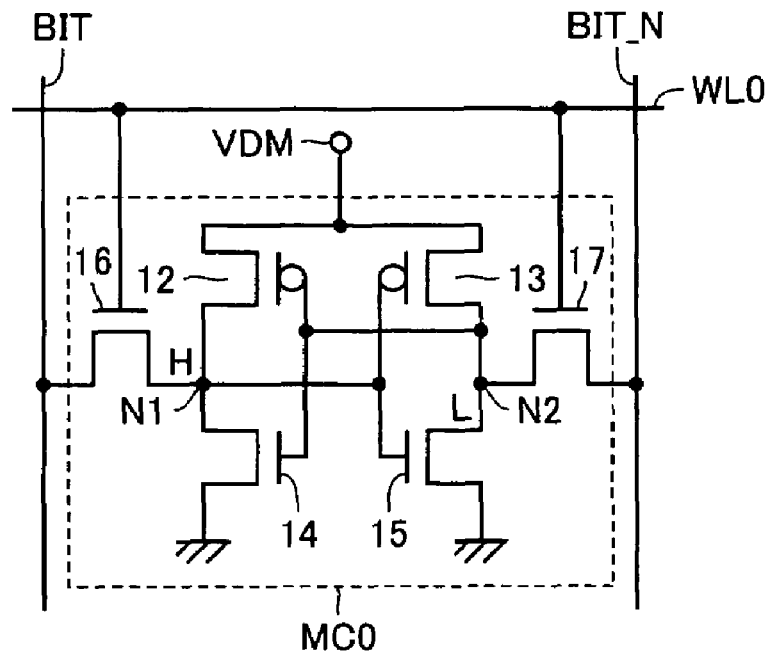
FIG. 14 shows potential levels of storage nodes of a memory cell MC0 in FIG. 13.
Figure 15:
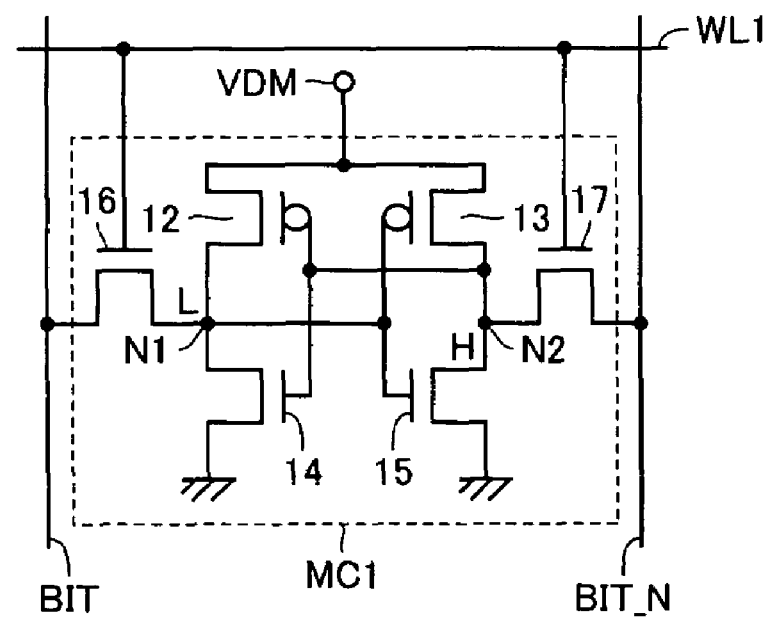
FIG. 15 shows potential levels of storage nodes of a memory cell MC1 in FIG. 13.

FIG. 14 illustrates the potential levels of storage nodes of memory cell MC0 in FIG. 13. FIG. 15 illustrates the potential levels of storage nodes of memory cell MC1 in FIG. 13. Referring to FIGS. 14 and 15, the potential state of node N1 in memory cell MC0 is at the H-level, and the potential state of node N2 in memory cell MC1 is at the H-level.

In the static semiconductor memory device of the invention, signal BI_W_ASSIST attains the H-level before the data is written into the plurality of memory cells MC. Referring to FIG. 13 again, A P-channel MOS transistor MA arranged between power supply node VDD and node VDM is turned off to open node VDM.

In write driver WD, an N-channel MOS transistor NM2 is connected between bit line BIT_N and the ground node. Similarly to N-channel MOS transistor NM1, N-channel MOS transistor NM2 equivalently represents the circuit connected to bit line BIT_N.

The gate of N-channel MOS transistor NM2 is connected to power supply node VDD. Therefore, both N-channel MOS transistors NM1 and NM2 are turned on so that the potential state of each of bit lines BIT and BIT_N attains the L-level.

As described above, even when the memory cells connected to one bit line pair include the memory cell(s) storing the data of "1" and the memory cell(s) storing the data of "0", write driver WD pulls out charges from open node VDM via the load transistors in the on state that are connected to bit line BIT or BIT_N, and thereby pulls down the potential of node VDM.

More specifically, when word line WL0 shown in FIG. 14 bears the potential at the H-level, N-channel MOS transistor NM1 in FIG. 13 lowers the potential of node VDM via bit line BIT, N-channel MOS transistor 16 and P-channel MOS transistor 12. N-channel MOS transistor NM2 in FIG. 13 lowers the potential of node VDM via bit line BIT_N, N-channel MOS transistor 16 and P-channel MOS transistor 13. Therefore, the potential of node VDM lowers to the absolute value of the threshold voltage of the load transistor that can discharge the charges.

In memory cell MC1 shown in FIG. 15, when the potential of word line WL1 is at the H-level, N-channel MOS transistors NM1 and NM2 in FIG. 13 lower the potential of node VDM.

In this case, write driver WD discharges the charges accumulated on node VDM and the charges accumulated on bit line pair BIT and BIT_N. However, the current does not flow from power supply node VDD to the ground node. Therefore, it is possible to prevent flow of a through-current in the CMOS inverter circuit forming each memory cell.

Figure 16:
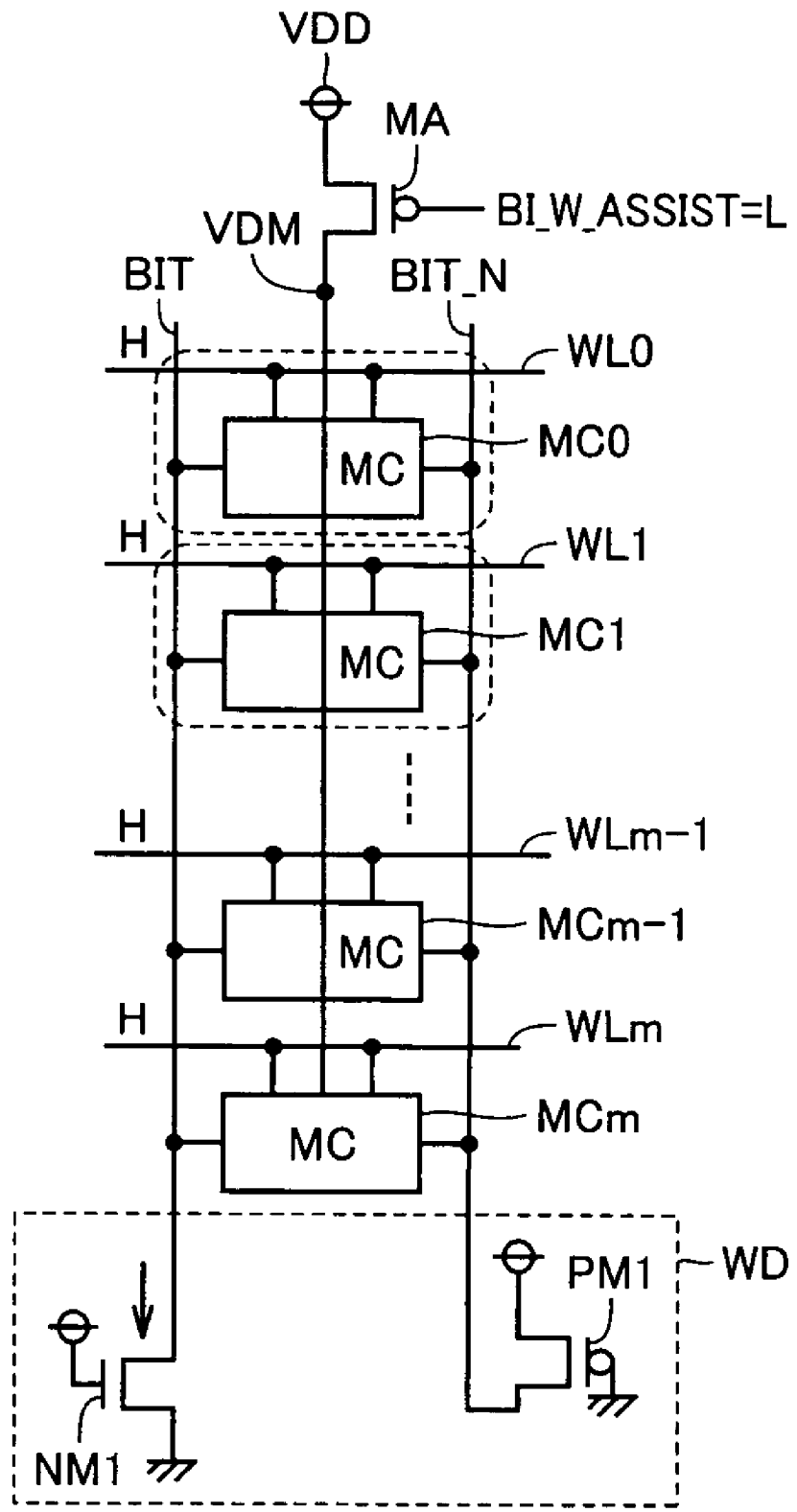
FIG. 16 shows a state attained for writing into the plurality of memory cells in the static semiconductor memory device according to the invention.

FIG. 16 illustrates a state for simultaneously writing data into the memory cells in the static semiconductor memory device of the invention. Referring to FIG. 16, signal BI_W_ASSIST attains the L-level in the write operation. Therefore, P-channel MOS transistor MA is turned on to connect node VDM to power supply node VDD.

It is assumed that write driver WD is in the normal write state. It is also assumed in FIG. 16 that bit lines BIT and BIT_N are at the L- and H-levels, respectively.

Figure 17:
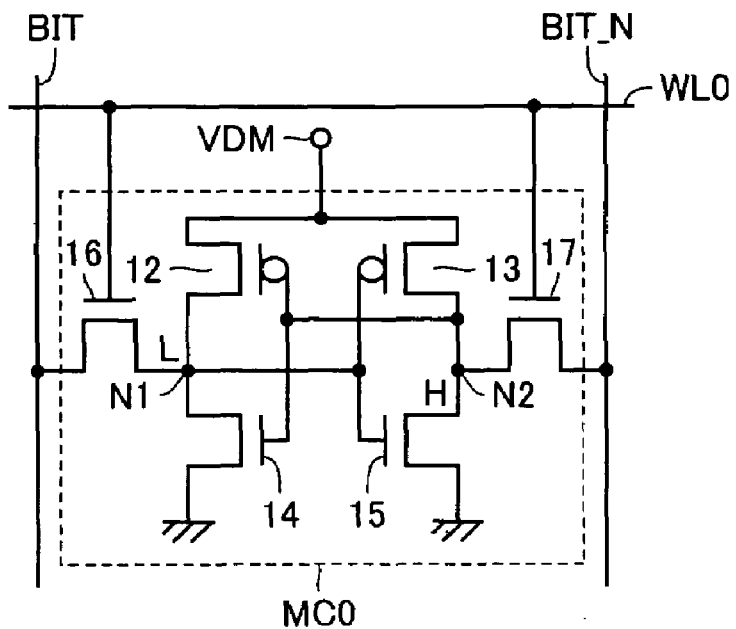
FIG. 17 shows potential levels of storage nodes of memory cell MC0 in FIG. 16.
Figure 18:
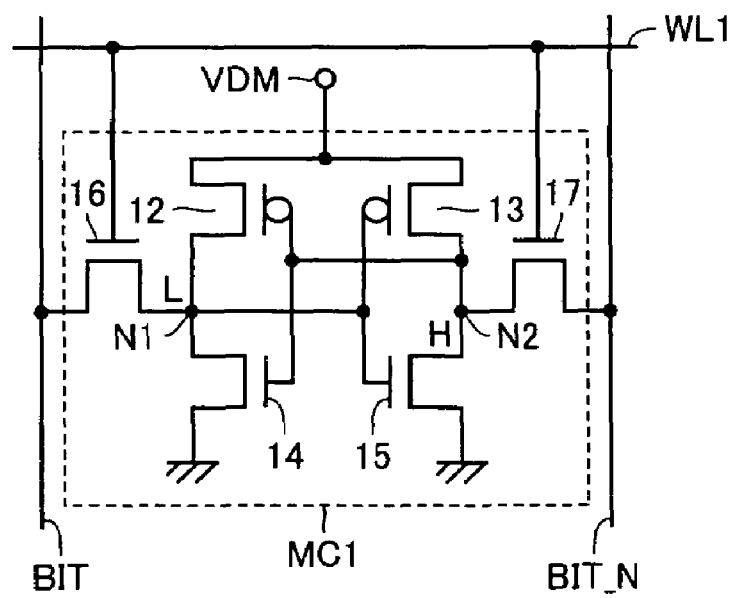
FIG. 18 shows potential levels of storage nodes of memory cell MC1 in FIG. 16.

FIG. 17 illustrates the potential levels of the storage nodes of memory cell MC0 in FIG. 16. FIG. 18 illustrates potential levels of the storage nodes of memory cell MC1 in FIG. 16. FIGS. 17 and 18 illustrate the potential states of nodes N1 and N2 attained when the potential of node VDM is in the vicinity of the ground potential, and the potentials of bit lines BIT and BIT_N attain the L- and H-levels, respectively. In the static semiconductor memory device of the invention, the potentials at the H- and L-levels are given to nodes N1 and N2, respectively, without causing imbalance between the current capability of the two load transistors (P-channel MOS transistors 12 and 13) included in each of memory cells MC0 and MC1 and the current capability of write driver WD in FIG. 16. Thereafter, node VDM is charged, and bit line BIT_N is charged. Thereby, data can be simultaneously written into the many memory cells connected to bit line pair BIT and BIT_N with write driver WD having a conventional size without passing the through-current. Accordingly, the stress can be simultaneously applied to the many memory cells.

According to the first embodiment, as described above, the potential of the power supply node of the memory cell is lowered in advance via the bit line pair before simultaneously effecting the writing on the plurality of memory cells, whereby the data can be simultaneously written into the plurality of memory cells within a short time without increasing the area of the write driver.

Second Embodiment

A whole structure of a static semiconductor memory device of a second embodiment is substantially the same as that of semiconductor memory device 100 shown in FIG. 1, and therefore description thereof is not repeated. The static semiconductor memory device of the second embodiment differs from that of the first embodiment only in the structure of power supply circuit 2, and the other structures are the same.

The structure of power supply circuit 2 of the second embodiment will now be described with reference to FIG. 2. Power supply circuit 2 of the second embodiment includes P-channel MOS transistors M0A and M1A instead of P-channel MOS transistors M0 and M1. In the second embodiment, each of P-channel MOS transistors M0A and M1A has the current supply capability smaller than that of any one of P-channel MOS transistors M01 and M02 included in each of precharge/equalize circuits P0 and P1. For example, each of P-channel MOS transistors M0A and M1A has a size ratio of W/L (i.e., a ratio between a channel length L and a channel width W) smaller than a size ratio of any one of P-channel MOS transistors M01 and M02 included in each of precharge/equalize circuits P0 and P1, whereby the current supply capabilities of P-channel MOS transistors M01 and M02 are adjusted. By setting the current supply capability of each of P-channel MOS transistors M0A and M1A as described above, a through-rate, i.e., a rate of time-change in potential of each of nodes VDM0 and VDM1 is smaller than that in the operation of changing the potential of one of paired bit lines from the L-level to the H-level. Accordingly, the time required for raising the potential state of each of nodes VDM0 and VDM1 from the L-level to the H-level is longer than that required for raising the potential of one of the paired bit lines from the L-level to the H-level.

Figure 19:
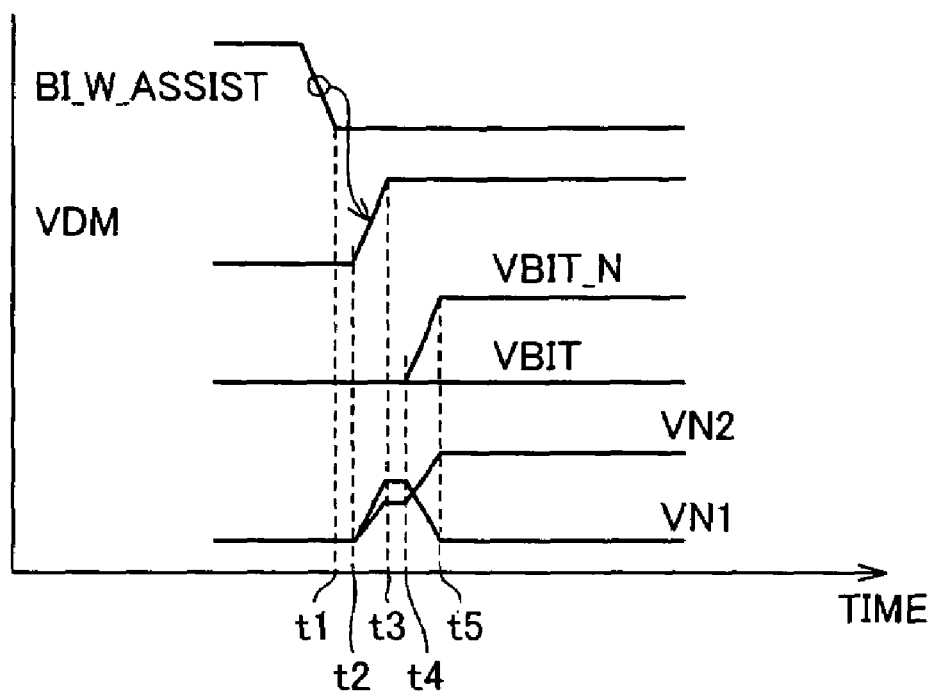
FIG. 19 illustrates a case in which a rate of time-change of potential of a node VDM0 is equal to that of a bit line BIT_N.

FIG. 19 illustrates the case where the time-change rate of the potential of node VDM0 is equal to that of bit line BIT_N. Referring to FIG. 19, potential VDM represents the potential of node VDM0. Potentials VBIT and VBIT. N represent the potentials of bit lines BIT0 and BIT_N0. Potentials VN1 and VN2 represent potentials VN1 and VN2 illustrated in FIG. 10. A period between times t1 and t4 in FIG. 19 and a period between times t4 and t5 correspond to the period between times t5 and t51 and the period between times t51 and t52 in FIG. 10, respectively.

At time t1, signal BI_W_ASSIST changes to the L-level. In response to this change, potential VDM changes from the L-level at time t2. At time t3, potential VDM attains the H-level. During a period between times t4 and t5, data of "0" is written into the plurality of memory cells so that potential VBIT_N changes from the L-level to the H-level. Potential VBIT remains at the L-level.

During the period between times t2 and t3, both potentials VN1 and VN2 rise according to the rising of potential VDM. During the period between times t3 and t4, potentials VN1 and VN2 maintain the same values as those at time t3. During the period between times t4 and t5, potentials VN1 and VN2 change according to the changes of potentials VBIT and VBIT_N. Therefore, potentials VN1 and VN2 attain the L- and H-levels, respectively. In this case, however, the data stored in each memory cell MC cannot be fixed at "0" or "1" during the period between times t2 and t5 so that the through-current flows in each memory cell MC, similarly to the conventional static semiconductor memory device.

Figure 20:
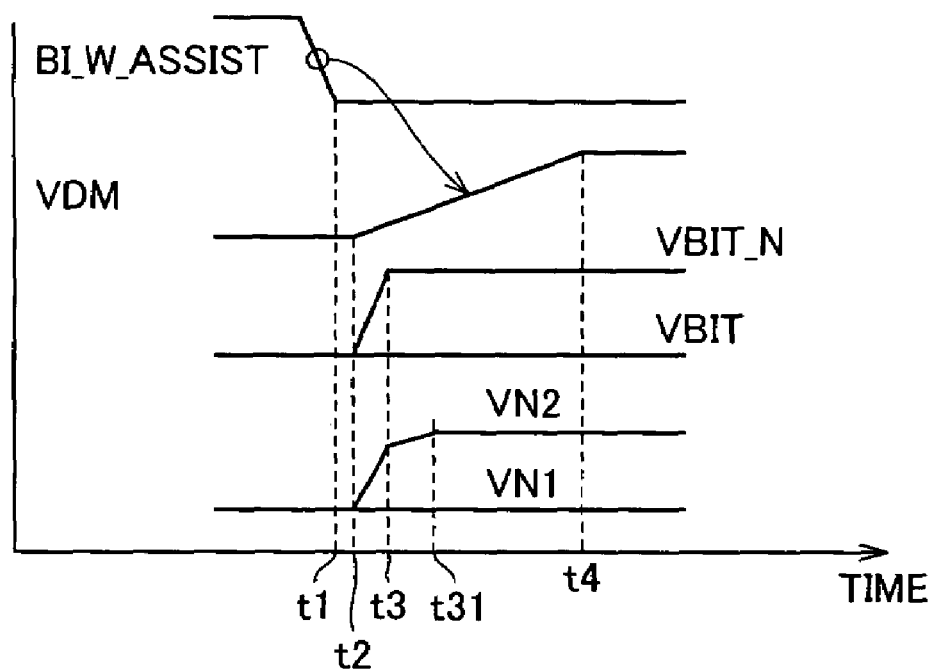
FIG. 20 illustrates changes in each signal waveform in a second embodiment.

FIG. 20 illustrates changes in various signal waveforms in the second embodiment. Referring to FIG. 20, the period from time t1 to time t2 and the period from time t2 to time t3 correspond to the period from time t5 to time t51 and the period from time t51 to time t52 in FIG. 10, respectively. The period from time t3 to time t4 in FIG. 20 is included in the period from time t52 to time t6 in FIG. 10.

The rate of time-change of potential VDM is smaller than the time-change of potential VBIT_N. Accordingly, potential VBIT_N reaches the H-level at time t3, and potential VDM reaches the H-level at time t4.

Potential VN2 starts to rise at time t2 according to the rising of potential VBIT_N. For the period between times t3 and t31, potential VN2 further rises according to the rising of potential VDM, and reaches the H-level at time t4. Since potential VBIT is at the L-level after time t2, potential VN1 is also at the L-level after time t2.

Since potential VDM changes as described above, potential VN2 changes only when potential VBIT_N changes. Therefore, it is possible to prevent flow of the through-current in memory cell MC.

For preventing the through-current in memory cell MC, the power supply circuit may have the following structure.

Figure 21:
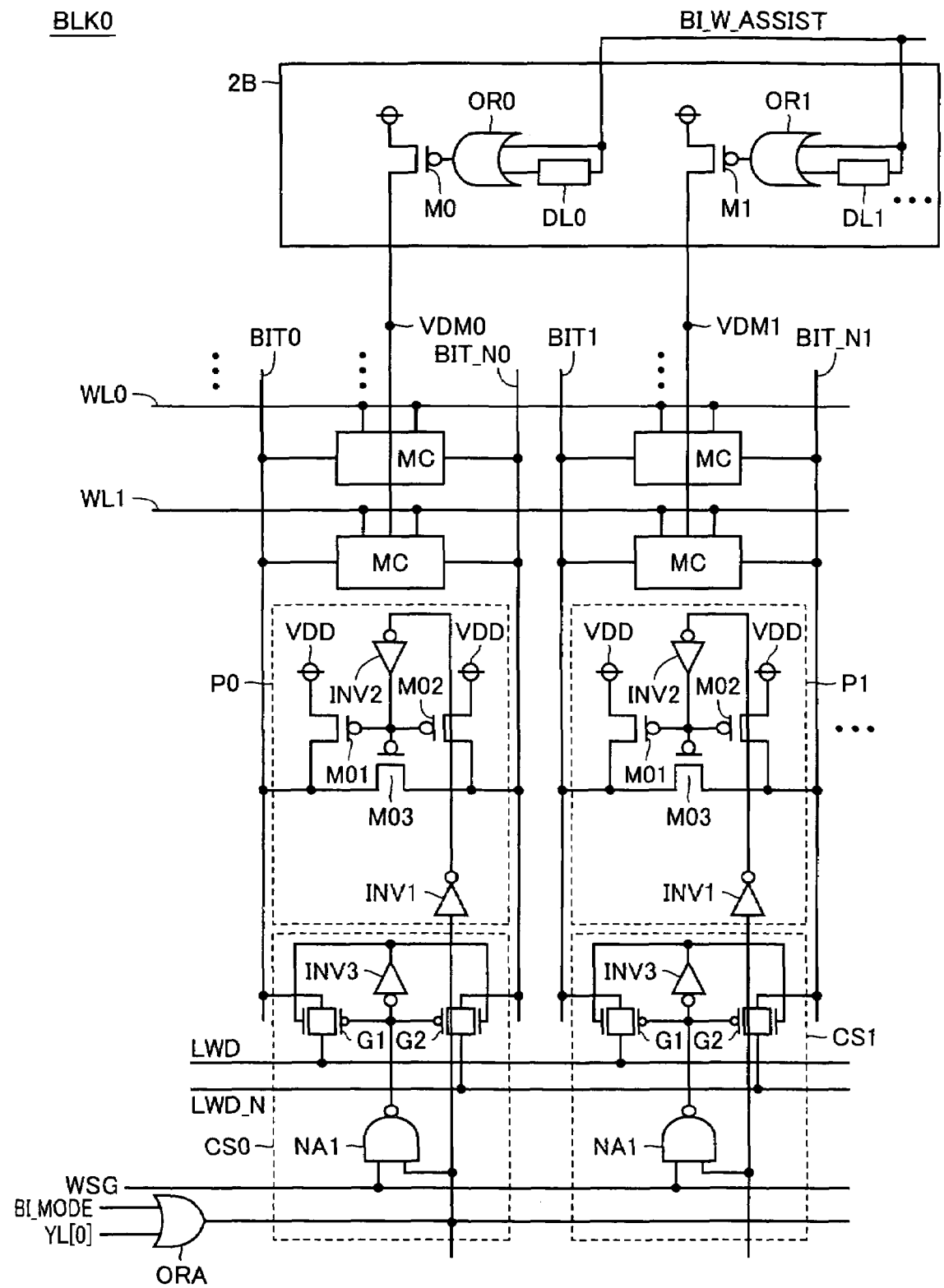
FIG. 21 shows a modification of the second embodiment.

FIG. 21 shows a modification of the second embodiment. Referring to FIG. 21, a power supply circuit 2B differs from power supply circuit 2 in FIG. 2 only in that it includes delay units DL0 and DL1 as well as OR circuits OR0 and OR1. The other structures of power supply circuit 2B are the same as those of power supply circuit 2, and therefore description thereof is not repeated. Delay circuit DL0 and OR circuit OR0 form the "delay circuit" in the invention, and delay circuit DL1 and OR circuit OR1 likewise form the "delay circuit" in the invention.

Each of delay units DL0 and DL1 delays received signal BI_W_ASSIST by a predetermined time for outputting it. OR circuit OR0 receives signal BI_W_ASSIST on one of its input terminals, receives the output of delay unit DL0 on the other input terminal and provides the signal to the gate of P-channel MOS transistor M0. OR circuit OR1 receives signal BI_W_ASSIST on one of its input terminals, and receives the output of delay unit DL1 on the other input terminal and provides the signal to the gate of P-channel MOS transistor M1.

Figure 22:
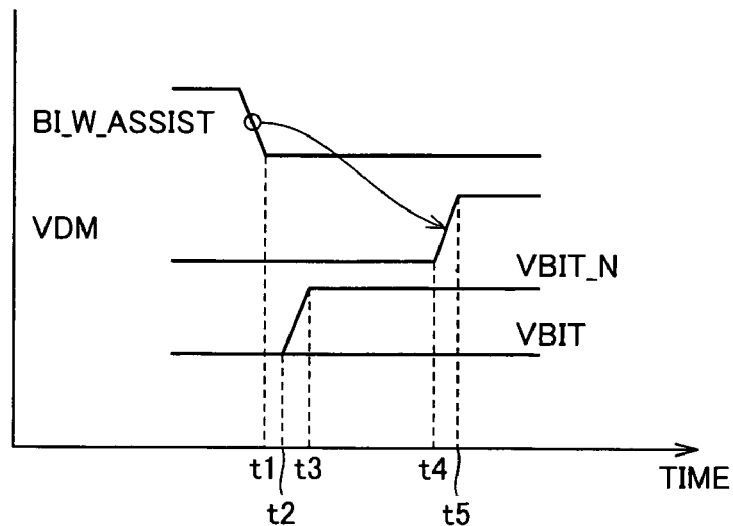
FIG. 22 illustrates changes in waveform of respective signals in the modification of the second embodiment shown in FIG. 21.

FIG. 22 illustrates changes in waveform of respective signals in the modification of the second embodiment shown in FIG. 21. Referring to FIG. 22, times t1, t2, t3, t4 and t5 correspond to time t5 and times t52, t53 and t54 in FIG. 10, respectively.

Potential VBIT_N changes from the L-level at time t2, and arrives at the H-level at time t3. Potential VDM changes from the L-level at time t4, and attains the H-level at time t5.

As described above, the rising of potential VDM starts later than the time when the bit line is fixed at the H-level so that the flow of the through-current in the memory cell can be prevented.

It is not necessary that the rising of potential VDM starts at the time later than the time when the bit line is fixed at the H-level. It is merely required that power supply circuit 2 supplies the power supply potential to node VDM0 after one of the paired two bit lines reaches a predetermined value. The "predetermined value" is, e.g., a value of a threshold voltage (e.g., of about 0.3 V to about 0.7 V) of the N-channel MOS transistor forming the memory cell.

As another modification of the second embodiment, P-channel MOS transistors M0 and M1 in power supply circuit 2B shown in FIG. 21 may be replaced with P-channel MOS transistors M0A and M1A, respectively. In this case, the time of start of rising of potential VDM can be later than the time when the bit line potential is fixed at the H-level, and the through-rate of the rising of potential VDM is slower than the through-rate of the rising of the bit line potential. Accordingly, the second modification of the second embodiment can prevent the flow of the through-current in the memory cell.

According to the second embodiment, as described above, the changes in potential supplied to the memory cell are different from the changes in potential of the bit line (i.e., the through-rate of the change is set slower, or the start time of rising is delayed), whereby the flow of the through-current in the memory cell can be prevented.

Third Embodiment

A static semiconductor memory device according to a third embodiment differs from the first and second embodiments in arrangement of the memory cells. The whole structure of the static semiconductor memory device of the third embodiment is substantially the same as that of semiconductor memory device 100 shown in FIG. 1, and therefore description thereof is not repeated. Further, each of the memory blocks included in semiconductor memory device 100 has substantially the same structure as block BLK0 shown in FIG. 2 or 21, and therefore description of the structure of the memory block is not repeated.

Figure 23:
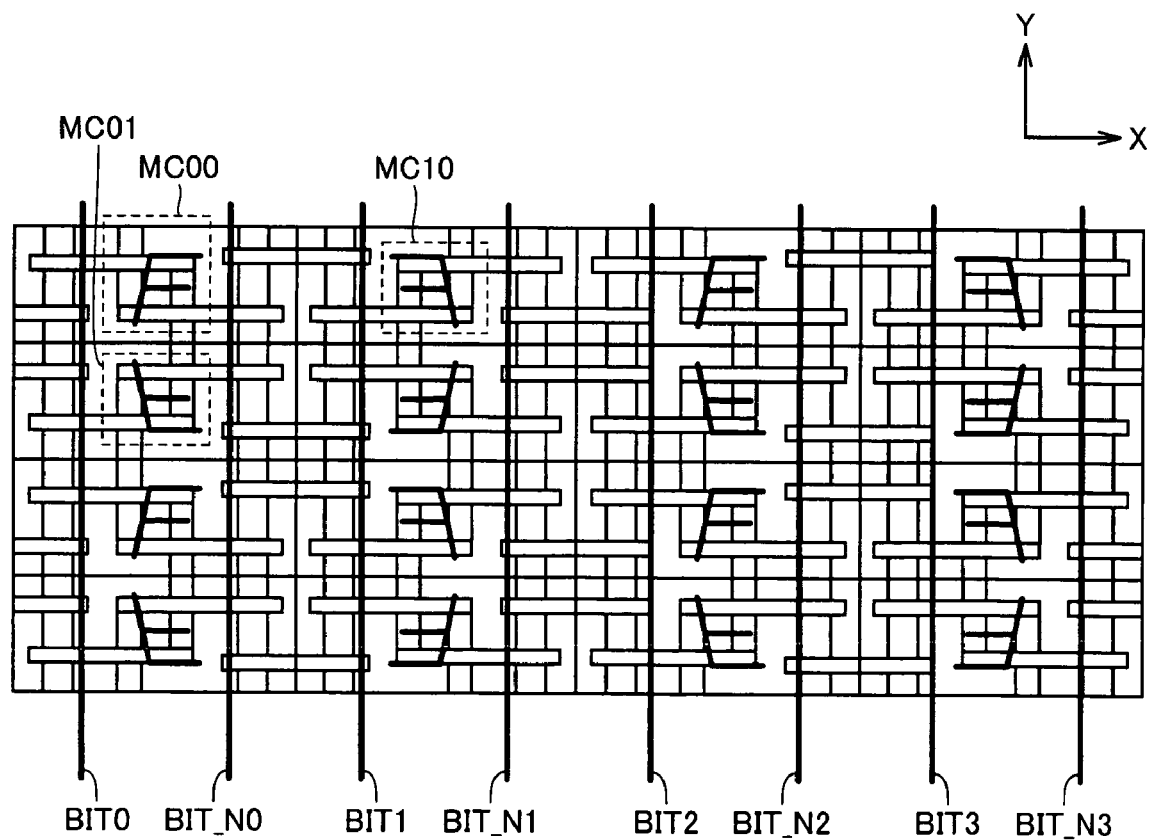
FIG. 23 schematically shows an arrangement of memory cells MC in a third embodiment.

FIG. 23 schematically shows an arrangement of memory cells MC in the third embodiment. Referring to FIG. 23, the plurality of memory cells are arranged such that two adjacent memory cells belonging to the same row have layouts that are symmetrical with respect to an axis parallel to a Y-axis. Among the plurality of memory cells, two adjacent memory cells belonging to the same column have layouts which are symmetrical with respect to an axis extending along the plurality of word lines (i.e., an axis parallel to an X-axis). For example, memory cells MC00 and MC10 have layouts that are symmetrical with respect to an axial parallel to the Y-axis. Also, memory cells MC00 and MC01 have layouts that are symmetrical with respect to an axial parallel to the X-axis. A symbol "F" shown on each memory cell in FIG. 23 is employed for indicating the direction of the memory cell.

Bit line pairs are arranged without inverting them with respect to the Y-axis. Bit line BIT0 is arranged on the left side of memory cell MC00, and bit line BIT_N0 is arranged on the right side of memory cell MC00. Bit line BIT1 is arranged on the left side of memory cell MC10, and bit line BIT_N1 is arranged on the right side of memory cell MC10. Thus bit lines BIT0, BIT_N0, BIT1 and BIT_N1 are arranged in this order with respect to the row direction. In summary, the first bit lines (e.g., bit lines BIT0 and BIT1) and the second bit lines (e.g., BIT_N0 and BIT_N1) are arranged alternately to each other with respect to the row direction.

Thus, nodes N1 and N2 in memory cell MC00 are connected to bit lines BIT0 and BIT_N0, respectively, when the corresponding word line (not shown) is selected. In memory cell MC10, nodes N1 and N2 are connected to bit lines BIT_N1 and BIT1, respectively, when the corresponding word line is selected.

FIG. 24 schematically shows a plan layout of memory cell MC00 in FIG. 23. Referring to FIGS. 24 and 4, memory cell MC00 includes nodes N1 and N2, two access transistors A and four active layers AVT. Each of nodes N1 and N2 as well as two access transistors A corresponds to gate electrode GA in FIG. 4.

FIG. 25 illustrates, in a table form, the potential states of nodes N1 and N2 of each memory cell attained when the data of "1" is written into the plurality of memory cells shown in FIG. 23.

Referring to FIG. 25, the table relates to the case in which the word lines in the plurality of even-numbered rows and the word lines in the plurality of odd-numbered rows are at the H-level, the bit lines BIT are at the H-level and bit lines BIT_N are at the L-level, and particularly illustrates the levels of nodes N1 and N2 included in each memory cell as well as the levels of the potentials applied to the gates of access transistors A.

As indicated by dotted lines in FIG. 25, one of nodes N1 of the two adjacent memory cells in the row direction attains the H-level, and the other attains the L-level. Also, one of nodes N2 of the two adjacent memory cells in the row direction attains the H-level, and the other attains the L-level.

FIG. 26 illustrates, in a table form, the potential states of nodes N1 and N2 of each memory cell attained when data of "0" is written into the plurality of memory cells shown in FIG. 23. Similarly to FIG. 25, FIG. 26 illustrates the levels of nodes N1 and N2 included in each memory cell as well as the levels of the potentials applied to the gates of access transistors A thereof. When the data of "0" is written into the plurality of memory cells, bit line BIT attains the L-level, and bit line BIT_N attains the H-level.

In FIG. 26, one of nodes N1 of the two adjacent memory cells in the row direction attains the H-level, and the other attains the L-level, similarly to FIG. 25. Also, one of nodes N2 of the two adjacent memory cells in the row direction attains the H-level, and the other attains the L-level.

In the static semiconductor memory device of the third embodiment, the same data is written into the plurality of memory cells so that a potential difference occurs between nodes N1 and N2 of each of the two adjacent memory cells in the row direction. Therefore, the static semiconductor memory device of the third embodiment can simultaneously apply the stress to all the memory cells without adding a special circuit.

In the third embodiment, the bit lines are not inverted in the column direction. Therefore, it is possible to cause a potential different between the adjacent bit lines such as bit lines BIT_N0 and BIT_1.

In the third embodiment, the two adjacent memory cells to each other in the column direction are symmetrical with respect to the X-axis for the purpose of sharing the interconnection connected to the ground node or the interconnection connected to the power supply node, and thereby minimizing the area of the memory cell array.

According to the third embodiment of the invention, the plurality of memory cells are arranged in an alternately inverted fashion with respect to the row direction, whereby the data can be simultaneously written into all the memory cells to apply the stresses to all the memory cells and between all the bit lines so that the time required for the burn-in test can be reduced.

Fourth Embodiment

A static semiconductor memory device of a fourth embodiment differs from the first to third embodiments in that the plurality of even-numbered word lines and the plurality of odd-numbered word lines are alternately selected. The whole structure of the static semiconductor memory device of the fourth embodiment is substantially the same as that of the semiconductor memory device 100 shown in FIG. 1, and therefore description thereof is not repeated. The structures of the blocks included in semiconductor memory device 100 are substantially the same as that of block BLK0 shown in FIG. 2 or 21, and therefore description thereof is not repeated.

The arrangement of the plurality of memory cells is substantially the same as that shown in FIG. 23, and therefore description thereof is not repeated.

FIG. 27 schematically shows a structure of a row predecoder included in the static semiconductor memory device of the fourth embodiment. Referring to FIG. 27, row predecoder 8 includes a plurality of AND circuits each receiving signal BI_ODD on one of its input terminals and receiving external clock CLK on the other input terminal. Row predecoder 8 further includes a plurality of AND circuits each receiving signal BI_EVEN on one of its input terminals and receiving external clock CLK on the other input terminal. In FIG. 27, AND circuits AN$2m$+2 and AN$2m$ provide first select signals for selecting the even-numbered word lines, and AND circuits AN$2m$+3 and AN$2m$+1 provide second signals for selecting the odd-numbered word lines. AND circuits AN$2m$+2 and AN$2m$ provide signals X$2m$+2 and X$2m$ as the first select signals, respectively, and AND circuits AN$2m$+3 and AN$2m$+1 select signals X$2m$+3 and X$2m$+1 as the second select signals, respectively.

FIG. 28 illustrates changes in waveform of the respective signals in the fourth embodiment. Referring to FIGS. 28 and 10, the waveforms in FIG. 28 differ from those in FIG. 10 in that signals BI_EVEN and BI_ODD alternately attain the H-level at every cycle of external clock CLK. In the waveform diagram of FIG. 28, therefore, potentials VWL($2m$) and VWL($2m$+1) likewise attain the H-level at every cycle of external clock CLK in contrast to the waveform diagram of FIG. 10. Other portions in the waveform diagram of FIG. 28 are substantially the same as those in FIG. 10, and therefore description thereof is not repeated.

Since the even-numbered word lines and the odd-numbered word lines are alternately and repetitively selected as described above, a potential difference occurs between the even- and odd-numbered word lines in the fourth embodiment. In the fourth embodiment, therefore, the stress can be applied between the word lines adjacent to each other.

The period during which potential VWL($2m$) is at the H-level as well as the period during which potential VWL($2m$+1) is at the H-level depend on the period during which external clock CLK is at the H-level. At time t1, potential VWL($2m$) changes to the H-level in response to the change of external clock CLK to the H-level. At time t3, potential VWL($2m$) changes to the L-level in response to the change of external clock CLK to the L-level. At time t1, potential VWL($2m$) changes to the H-level in response to the change of external clock CLK to the H-level.

Also, potential VWL($2m$+1) changes at time t3 to the H-level in response to the change of external clock CLK to the H-level. At time t6, potential VWL($2m$+1) changes to the L-level in response to the change of external clock CLK to the L-level.

If potential VWL($2m$) changes from the H-level to the L-level at time t4, charging of the word line and discharging of the word line are simultaneously performed when external clock CLK rises. Therefore, the current for charging the word line and the current discharged from the word line are concentrated. If potential VWL($2m$+1) changes from the H-level to the L-level at time t7, the current for charging the word line and the current discharged from the word line are likewise concentrated. In the fourth embodiment, the period during which the word line is at the H-level is determined depending on the period during which external clock CLK is at the H-level. In the fourth embodiment, therefore, it is possible to prevent concentration of the currents at the time when the external clock rises.

The data are written into the memory cell as follows. During the period between times t2 and t3, data of "1" is written into the memory cells in the even-numbered rows of each block. During the period between times t5 and t6, data of "0" is written into the memory cells in the odd-numbered rows of each block. After time t7, data of "0" is written into the memory cells in the even-numbered rows.

According to the fourth embodiment, as described above, the row predecoder alternately selects the plurality of even-numbered word lines and the plurality of odd-numbered word lines so that the stress can be applied between the word lines adjacent to each other.

Fifth Embodiment

A whole structure of a static semiconductor memory device of a fifth embodiment is substantially the same as that of semiconductor memory device 100 shown in FIG. 1, and therefore description thereof is not repeated. A structure of a block included in semiconductor memory device 100 is substantially the same as that of block BLK0 shown in FIG. 2 or 21, and therefore description thereof is not repeated.

An arrangement of a plurality of memory cells in the fifth embodiment is substantially the same as that shown in FIG. 23, and therefore description thereof is not repeated.

In the fifth embodiment, one of the even-numbered word line and the odd-numbered word line is activated, and the other word line is always kept inactive. Thus, in the fifth embodiment, row predecoder 8 shown in FIG. 27 provides, as signal XA, first select signals (signals X$2m$+2 and X$2m$) or second select signals (signals X$2m$+3 and X$2m$+1). Write driver WD shown in FIG. 2 continuously writes the data of "1" and "0" into each of the memory cells connected to the plurality of selected word lines. The order of the data written into the memory cells is not restricted, and the data may be written into the memory cells in the order of "0" and "1".

In the burn-in mode of the static semiconductor memory device of the invention, the potential of node VDM of the memory cell is lowered from the power supply potential in accordance with signal BI_W_ASSIST at every cycle of external clock CLK. Accordingly, the data written into the memory cell in a certain cycle of external clock CLK will be destroyed in the next cycle. However, the fifth embodiment can apply the stress between the memory cells adjacent to each other in the row direction as described below.

FIG. 29 illustrates potential states of nodes N1 and N2 of the memory cells and the gates of access transistors A thereof in the fifth embodiment.

FIG. 29 illustrates the potential states of nodes N1 and N2 as well as the gates of access transistors A in such a state that the even-numbered word lines are selected, the odd-numbered word lines are unselected and data of "1" is written into the memory cells connected to the even-numbered word lines. In this case, the data of the memory cells connected to the odd-numbered word lines are undefined. In the figure, "X" indicates that the data is undefined. Accordingly, the memory cells in the H-level exist in a striped fashion (referred to as "row stripes") in the whole structure formed of the plurality of memory cells.

The test is conducted on the memory cells connected to the odd-numbered word lines. For this test, the chips determined as faulty chips due to a failure such a short are already removed. Although the data in the memory cells connected to the odd-numbered word lines are undefined, local variations in threshold voltage are present in the memory cell array so that data can readily attain "1" or "0". Therefore, each of the memory cells connected to the odd-numbered word lines has stored a fixed value of "1" or "0".

FIG. 30 is another diagram illustrating the potentials of nodes N1 and N2 of each memory cell and gates of access transistors A thereof in the fifth embodiment.

Referring to FIG. 30, the illustrated potential states of nodes N1 and N2 as well as gates of access transistors A are attained in such a state that the even-numbered word lines are selected, the odd-numbered word lines are unselected and data of "0" is written into the memory cells connected to the even-numbered word lines. The data of the memory cells connected to the odd-numbered word lines are undefined, but are kept at fixed values.

As shown in FIGS. 29 and 30, each memory cell connected to the odd-numbered word line is located between the memory cell storing the data of "1" and connected to the even-numbered word line and the memory cell storing the data of "0" and connected to the even-numbered word line. Therefore, as indicated by portions enclosed with dotted lines in FIGS. 29 and 30, a potential difference occurs at least one time between nodes N1 and N2 of the memory cell connected to the odd-numbered word line and nodes N1 and N2 of the memory cell connected to the even-numbered word line.

In the fifth embodiment, a potential difference is caused between nodes N1 and N2 of the memory cell connected to the even-numbered word line at every cycle of external clock CLK in the burn-in mode. Therefore, the potential difference is caused between the storage nodes of two memory cells adjacent to each other in the row direction and between the storage nodes of the two memory cells adjacent to each other in the column direction at every cycle of the external clock.

FIG. 31 is still another diagram illustrating the potential states of nodes N1 and N2 of each memory cell and gates of access transistors A thereof in the fifth embodiment.

FIG. 31 illustrates the potential states of nodes N1 and N2 as well as gates of access transistors A that are attained in such a state that the odd-numbered word lines are selected, the even-numbered word lines are unselected and data of "1" is written into the memory cells connected to the odd-numbered word lines. FIG. 31 corresponds to FIG. 29, and differs therefrom in that the data of the memory cells connected to the even-numbered word lines are undefined, and the data of the memory cells connected to the odd-numbered word lines take the value of "1". Other portions in FIG. 31 are substantially the same as those in FIG. 29, and therefore description thereof is not repeated.

FIG. 32 is further another diagram illustrating the potential states of nodes N1 and N2 of each memory cell and gates of access transistors A thereof in the fifth embodiment.

FIG. 32 illustrates the potential states of nodes N1 and N2 as well as gates of access transistors A that are attained in such a state that the odd-numbered word lines are selected, the even-numbered word lines are unselected and data of "0" is written into the memory cells connected to the odd-numbered word lines. FIG. 32 corresponds to FIG. 30, and differs therefrom in that the data of the memory cells connected to the even-numbered word lines are undefined, and the data of the memory cells connected to the odd-numbered word lines take the value of "0". Other portions in FIG. 32 are substantially the same as those in FIG. 30, and therefore description thereof is not repeated.

As illustrated in FIGS. 31 and 32, even when the memory cells connected to the even-numbered word lines store undefined data, a potential difference occurs at least one time between nodes N1 and N2 of the memory cells connected to the even-numbered word lines and nodes N1 and N2 connected to the word lines in the odd-numbered word lines. Accordingly, a potential difference is applied between the storage nodes of the two adjacent memory cells in the row directions and between those of the two adjacent memory cells in the column direction at every test cycle in the burn-in mode.

According to the fifth embodiment of the invention, as described above, the memory cells are arranged repetitively in such a fashion that the memory cells are inverted in the row and column directions, and only the odd-numbered rows or even-numbered rows are selected. Thereby, it becomes possible to simplify the test and further to apply the stress between the storage nodes of the adjacent memory cells in the row direction and the column direction.

According to the fifth embodiment, only the odd-numbered rows or the even-numbered rows are selected so that the stress can be applied between the adjacent word lines.

Sixth Embodiment

Figure 33:
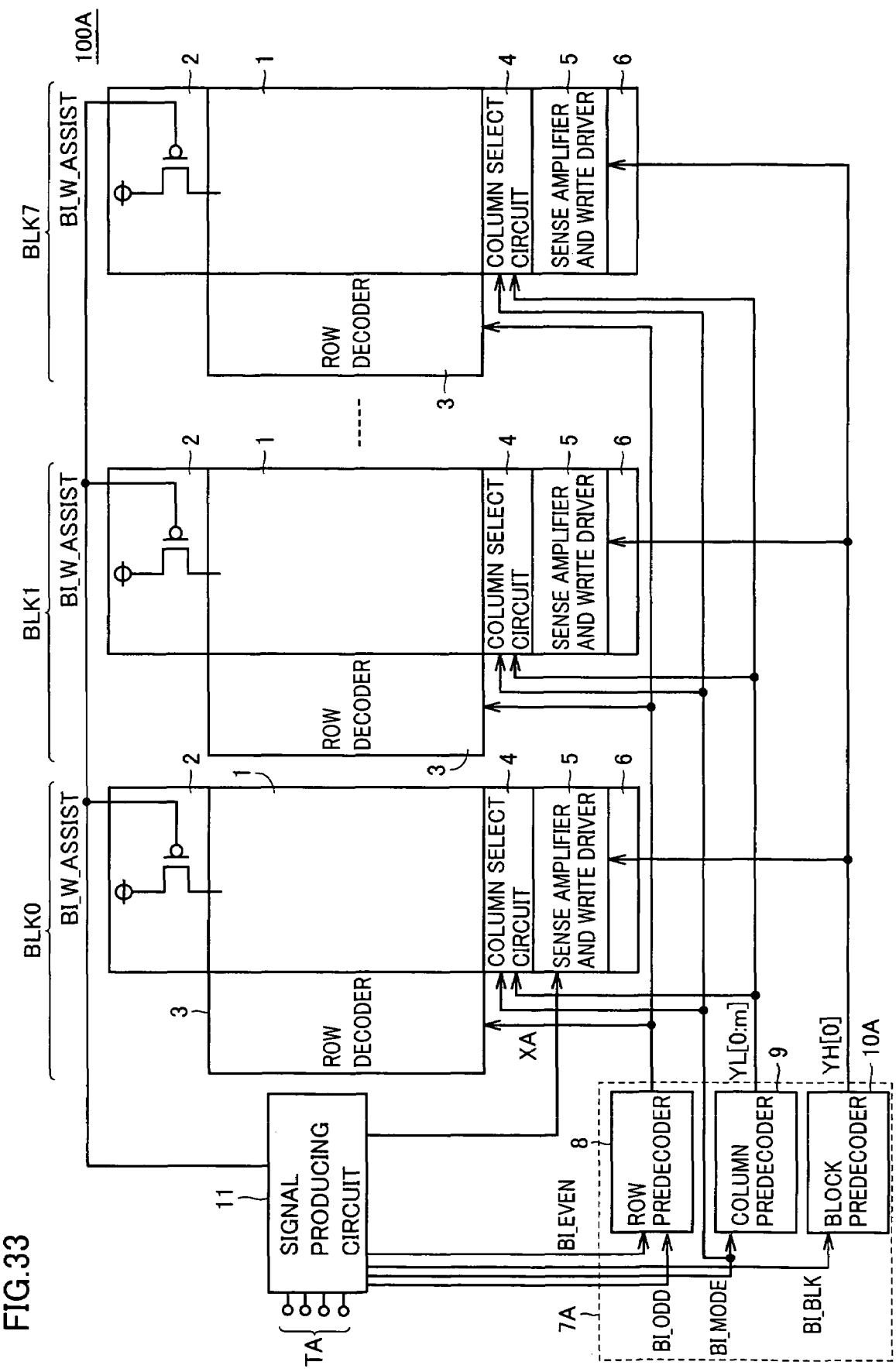
FIG. 33 shows a whole structure of a static semiconductor memory device according to a sixth embodiment.

FIG. 33 shows a whole structure of a static semiconductor memory device according to a sixth embodiment. Referring to FIG. 33, a semiconductor memory device 100A differs from semiconductor memory device 100 shown in FIG. 1 in that a control circuit 7A is employed in stead of control circuit 7. Other structures are substantially the same as those of semiconductor memory device 100 in FIG. 1, and therefore description thereof is not repeated.

Control circuit 7A differs from control circuit 7 in that a block predecoder 10A is replaced with block predecoder 10. Other structures are substantially the same as those of control circuit 7, and therefore description thereof is not repeated.

Block predecoder 10A receives a signal BI_BLK transmitted from signal producing circuit 11, and provides signals YH[0:7]. Signal BI_BLK is produced for selecting the block to be used as a test target in the burn-in test mode. Similarly to the first to fifth embodiments, when signal BI_BLK is at the H-level, all signals YH[0:7] (i.e., signals YH[0]-YH[7]) become active. Therefore, blocks BLK0-BLK7 are simultaneously selected. When signal BI_BLK is at the L-level, only one of signals YH[0]-YH[7] becomes active. Therefore, only the memory block receiving the active signal among signals YH[0]-YH[7] is selected as the burn-in test target. FIG. 33 represents the state in which block predecoder 10A transmits active signal YH[0]. In this case, row and column predecoders 8 and 9 transmit signals XA and signals YL[0:m] to the selected block (e.g., block BLK0).

Depending on the capacity of the memory mounted on the chip, such a case may occur that the current exceeds a current capacity of a semiconductor tester due to an excessively large current caused by charging and discharging even when a through-current does not flow in the memory cell. In the sixth embodiment, one memory block selected from among the plurality of memory blocks can be activated according to signal BI_BLK so that the foregoing problem can be overcome.

The number of the block(s) that is selected by block predecoder 10A when signal BI_BLK is at the L-level is not restricted to one, and may be, e.g., two or four.

FIG. 34 illustrates changes in waveform of the respective signals in the sixth embodiment. Referring to FIGS. 34 and 28, the waveforms illustrated in FIG. 34 differ from the waveforms illustrated in FIG. 28 in that FIG. 34 does not illustrate signals YH[0:7], and alternatively illustrates active signal YH[0] among signals YH[0:7] as well as inactive signals YH[1]-YH[7] (illustrated as signals "YH[1:7]" in FIG. 34).

Other points are substantially the same as those in FIG. 28, and therefore description thereof is not repeated. In this case, block BLK0 is selected, and data is written into the plurality of memory cells included in block BLK0. The operation of writing the data into the plurality of memory cells included in block BLK0 is substantially the same as the write operation illustrated in FIG. 28, and therefore description thereof is not repeated.

According to the sixth embodiment as described above, the device includes the block predecoder that activates only the designated block among the plurality of blocks according to the block designation signal in the burn-in mode. According to the sixth embodiment, therefore, the data can be written simultaneously into the plurality of memory cells without exceeding the capacity of the semiconductor tester (or the capacity of the semiconductor memory device).

The invention can be applied to cases other than the burn-in, and particularly to the cases wherein data is to be written simultaneously into a large number of memory cells.

In the invention, when the data is to be written simultaneously into a large number of memory cells, all the word lines in a certain block may be selected, or all the blocks may be selected. In this invention, the conditions for selecting the plurality of memory cells as the write targets are not particularly restricted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static semiconductor memory device having a test mode, comprising:

a plurality of memory cells arranged in rows and columns, each having a storage node pair statically holding complementary potentials while a power supply potential is being supplied, and each having two load MOS transistors, two driver MOS transistors, and two access MOS transistors;

a plurality of word lines arranged for the respective rows of said plurality of memory cells;

a row select circuit selecting a plurality of target word lines as a unit from among said plurality of word lines according to a provided row select signal;

a plurality of bit line pairs arranged corresponding to the columns of said plurality of memory cells, respectively, and each having first and second bit lines connected to said two access MOS transistors, respectively;

a column select circuit selectively activating said plurality of bit line pairs in accordance with a provided column select signal;

a power supply circuit selectively supplying a power supply potential to each of said plurality of memory cells;

a write circuit writing data into memory cells connected to said plurality of target word lines among said plurality of memory cells and setting potential states of said first and second bit lines according to a supply instruction signal; and a control circuit receiving a signal selecting said plurality of target word lines, and providing said row select signal and said column select signal, wherein in said test mode in which data are written into said plurality of memory cells, said power supply circuit stops supply of said power supply potential to each of said plurality of memory cells by setting both potential states of said first and second bit lines to an inactive level in response to inactivation of said supply instruction signal at a first step, said write circuit sets the potential state of one of said first and second bit lines according to said data to an active level and the potential state of the other bit line to the inactive level in response to activation of said instruction signal at a second step, and said power supply circuit supplies said power supply potential to each of said plurality of memory cells in response to activation of said supply instruction signal, after said second step.

2. The static semiconductor memory device according to claim 1, wherein said column select signal is a signal selecting said plurality of bit line pairs as a unit, and said row select signal is a signal selecting said plurality of word lines while handling said plurality of target word lines as a unit.

3. A static semiconductor memory device having a test mode, comprising:

a plurality of memory cells arranged in rows and columns, and each having a storage node pair statically holding complementary potentials while a power supply potential is being supplied;

a plurality of word lines arranged for the respective rows of said plurality of memory cells;

a row select circuit selecting a plurality of target word lines as a unit from among said plurality of word lines according to a provided row select signal;

a power supply circuit supplying a power supply potential to each of said plurality of memory cells in response to activation of a supply instruction signal, and stopping the supply of the power supply potential to each of said plurality of memory cells in response to inactivation of said supply instruction signal during said test mode;

a write circuit writing data into memory cells connected to said plurality of target word lines among said plurality of memory cells;

a plurality of bit line pairs arranged corresponding to the columns of said plurality of memory cells, respectively, and each having first and second bit lines;

a column select circuit selectively activating said plurality of bit line pairs in accordance with a provided column select signal;

a control circuit receiving a signal selecting said plurality of target word lines, and providing said row select signal and said column select signal; and a plurality of precharge circuits arranged corresponding to said plurality of bit line pairs, respectively, wherein said write circuit sets both potential states of said first and second bit lines to an inactive level when said supply instruction signal is inactive, and operates in response to activation of said supply instruction signal to set the potential state of one of said first and second bit lines according to said data to an active level, and to set the potential state of the other bit line to the inactive level during said test mode, each of said plurality of memory cells has a potential input node receiving said power supply potential, said power supply circuit supplies said power supply potential to said potential input node of each of said plurality of memory cells such that a time required for changing the potential state of said potential input node from an inactive level to an active level is longer than the time required for changing the potential state of one of said first and second bit lines from the inactive level to the active level, said power supply circuit includes a plurality of first transistors arranged corresponding to said plurality of bit line pairs, respectively, and each having a control electrode receiving said supply instruction signal, one end connected to a power supply node and the other end commonly connected to said potential input nodes of said plurality of memory cells belonging to the corresponding bit line pair, and each of said plurality of precharge circuits includes:

a second transistor supplying said power supply potential to the corresponding first bit line, and a third transistor supplying said power supply potential to the corresponding second bit line; and a current supply capability of said first transistor is smaller than the current supply capability of each of said second and third transistors.

4. A static semiconductor memory device having a test mode, comprising:

a plurality of memory cells arranged in rows and columns, and each having a storage node pair statically holding complementary potentials while a power supply potential is being supplied;

a plurality of word lines arranged for the respective rows of said plurality of memory cells;

a row select circuit selecting a plurality of target word lines as a unit from among said plurality of word lines according to a provided row select signal;

a power supply circuit supplying a power supply potential to each of said plurality of memory cells in response to activation of a supply instruction signal, and stopping the supply of the power supply potential to each of said plurality of memory cells in response to inactivation of said supply instruction signal during said test mode;

a write circuit writing data into memory cells connected to said plurality of target word lines among said plurality of memory cells;

a plurality of bit line pairs arranged corresponding to the columns of said plurality of memory cells, respectively, and each having first and second bit lines;

a column select circuit selectively activating said plurality of bit line pairs in accordance with a provided column select signal;

a control circuit receiving a signal selecting said plurality of target word lines, and providing said row select signal and said column select signal; and a plurality of precharge circuits arranged corresponding to said plurality of bit line pairs, respectively, wherein said write circuit sets both potential states of said first and second bit lines to an inactive level when said supply instruction signal is inactive, and operates in response to activation of said supply instruction signal to set the potential state of one of said first and second bit lines according to said data to an active level, and to set the potential state of the other bit line to the inactive level during said test mode, said power supply circuit includes:

a plurality of delay circuits arranged corresponding to said plurality of bit line pairs, respectively, and each delaying said supply instruction signal by a predetermined period; and a plurality of first transistors arranged corresponding to said plurality of bit line pairs, respectively, and each having a control electrode receiving a signal provided from the corresponding delay circuit, one end connected to a power supply node and the other end commonly connected to said potential input nodes of said plurality of memory cells belonging to the corresponding bit line pair, each of said plurality of precharge circuits includes:

a second transistor supplying said power supply potential to the corresponding first bit line, and a third transistor supplying said power supply potential to the corresponding second bit line; and a current supply capability of said first transistor is smaller than the current supply capability of each of said second and third transistors.

5. The static semiconductor memory device according to claim 1, wherein each of said plurality of bit line pairs is arranged in the order of said first bit line and said second bit line in said row direction, said storage node pair has first and second storage nodes, one of two memory cells located in the same row and adjacent to each other has said first and second storage nodes respectively connected to said first and second bit lines when the corresponding word line is selected, and the other of said two memory cells has said first and second storage nodes respectively connected to said second and first bit lines when said corresponding word line is selected, and two memory cells included in said plurality of memory cells, located in the same column and adjacent to each other have layouts symmetrical with respect an axis extending in the direction of extension of said plurality of word lines.

6. The static semiconductor memory device according to claim 1, wherein said write circuit writes the same data into said plurality of memory cells.

7. The static semiconductor memory device according to claim 1, wherein said row select circuit alternately selects a plurality of even-numbered word lines and a plurality of odd-numbered word lines in said plurality of word lines, and said write circuit writes first data into memory cells connected to said plurality of even-numbered word lines when said plurality of even-numbered word lines are selected, and writes second data different from said first data into memory cells connected to said plurality of odd-numbered word lines when said plurality of odd-numbered word lines are selected.

8. The static semiconductor memory device according to claim 1, wherein said row select signal has:

a first select signal for selecting said plurality of even-numbered word lines, and a second select signal for selecting said plurality of odd-numbered word lines;

said control circuit provides said first select signal according to an externally applied clock signal, provides said second select signal according to said clock signal, and alternately provides said first and second select signals at every cycle of said clock; and said first and second select signals are both activated when said clock signal rises, and are both inactivated when said clock signal falls.

9. The static semiconductor memory device according to claim 1, wherein said row select signal is a signal for selecting a plurality of even-numbered word lines or a plurality of odd-numbered word lines from among said plurality of word lines, and said write circuit continuously writes first data and second data different from said first data into each of memory cells connected to the plurality of selected word lines.

10. The static semiconductor memory device according to claim 1, wherein said plurality of memory cells arranged in rows and columns are divided into a plurality of column blocks, and said control circuit selects at least one column block among said plurality of column blocks according to a provided block select signal, and provides said row select signal and said column select signal to the selected column block.

* * * * *